United States Patent
Yamasaki et al.

(10) Patent No.: US 10,734,406 B2
(45) Date of Patent: Aug. 4, 2020

(54) SEMICONDUCTOR MEMORY DEVICE AND METHOD OF MANUFACTURING THE SAME

(71) Applicant: Toshiba Memory Corporation, Minato-ku (JP)

(72) Inventors: Hiroyuki Yamasaki, Nagoya (JP); Hideaki Harakawa, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/284,395

(22) Filed: Feb. 25, 2019

(65) Prior Publication Data
US 2020/0066749 A1 Feb. 27, 2020

(30) Foreign Application Priority Data
Aug. 23, 2018 (JP) .................. 2018-156248

(51) Int. Cl.
| | |
|---|---|
| H01L 27/1157 | (2017.01) |
| H01L 27/11582 | (2017.01) |
| G11C 16/04 | (2006.01) |
| G11C 16/08 | (2006.01) |
| H01L 27/11565 | (2017.01) |
| G11C 16/26 | (2006.01) |

(52) U.S. Cl.
CPC .... *H01L 27/11582* (2013.01); *G11C 16/0483* (2013.01); *H01L 27/1157* (2013.01); *G11C 16/08* (2013.01); *G11C 16/26* (2013.01); *H01L 27/11565* (2013.01)

(58) Field of Classification Search
CPC .................................................. H01L 27/115
See application file for complete search history.

(56) References Cited

U.S. PATENT DOCUMENTS

| | | | |
|---|---|---|---|
| 7,558,141 B2 | 7/2009 | Katsumata et al. | |
| 7,847,342 B2 | 12/2010 | Fukuzumi et al. | |
| 9,679,907 B1 | 6/2017 | Kaneko | |
| 9,741,812 B1* | 8/2017 | Adusumilli | H01L 23/485 |
| 2016/0197092 A1 | 7/2016 | Hong | |
| 2017/0140993 A1* | 5/2017 | Basker | H01L 29/435 |
| 2019/0371891 A1* | 12/2019 | Goktepeli | H01L 29/66795 |
| 2019/0378790 A1* | 12/2019 | Bohr | H01L 21/76897 |
| 2019/0386103 A1* | 12/2019 | Do | H01L 21/823885 |

FOREIGN PATENT DOCUMENTS

| | | |
|---|---|---|
| JP | 2008-171839 | 7/2008 |
| JP | 2009-135324 | 6/2009 |
| TW | 201630146 A | 8/2016 |

* cited by examiner

*Primary Examiner* — Thao P Le
(74) *Attorney, Agent, or Firm* — Oblon, McClelland, Maier & Neustadt, L.L.P.

(57) ABSTRACT

According to one embodiment, a semiconductor memory device includes first conductive films, a second conductive film, a first pillar including a first semiconductor film and a first insulator, a second semiconductor film, and a second pillar including a second insulator and a third conductive film. The first conductive films are stacked with respective insulator layers interposed therebetween. The second conductive film is provided above the first conductive films with an insulator layer interposed therebetween. The first semiconductor film penetrate the first conductive films in a stacking direction of the first conductive films. The first insulator is provided on a side surface of the first semiconductor film.

20 Claims, 36 Drawing Sheets

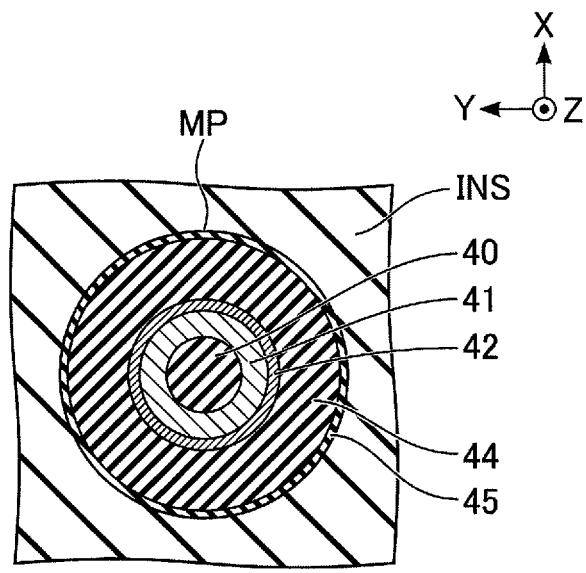
F I G. 7
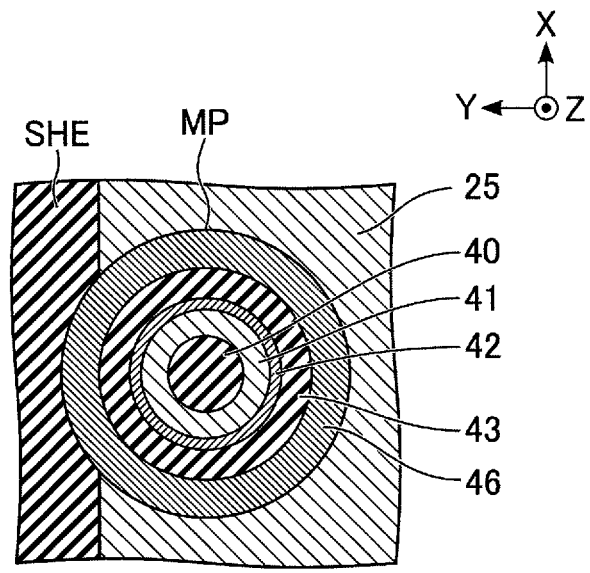
F I G. 8

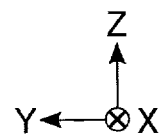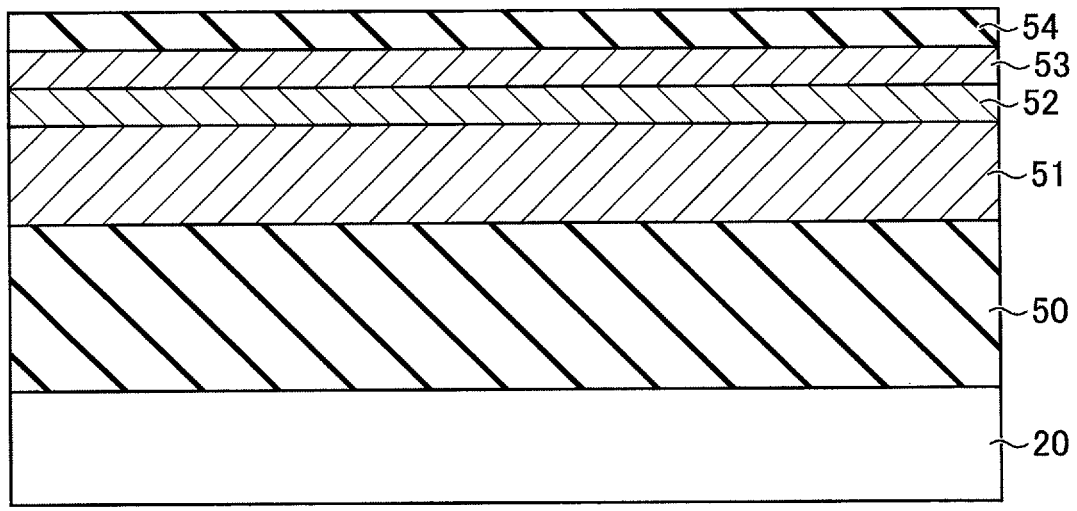
F I G. 9

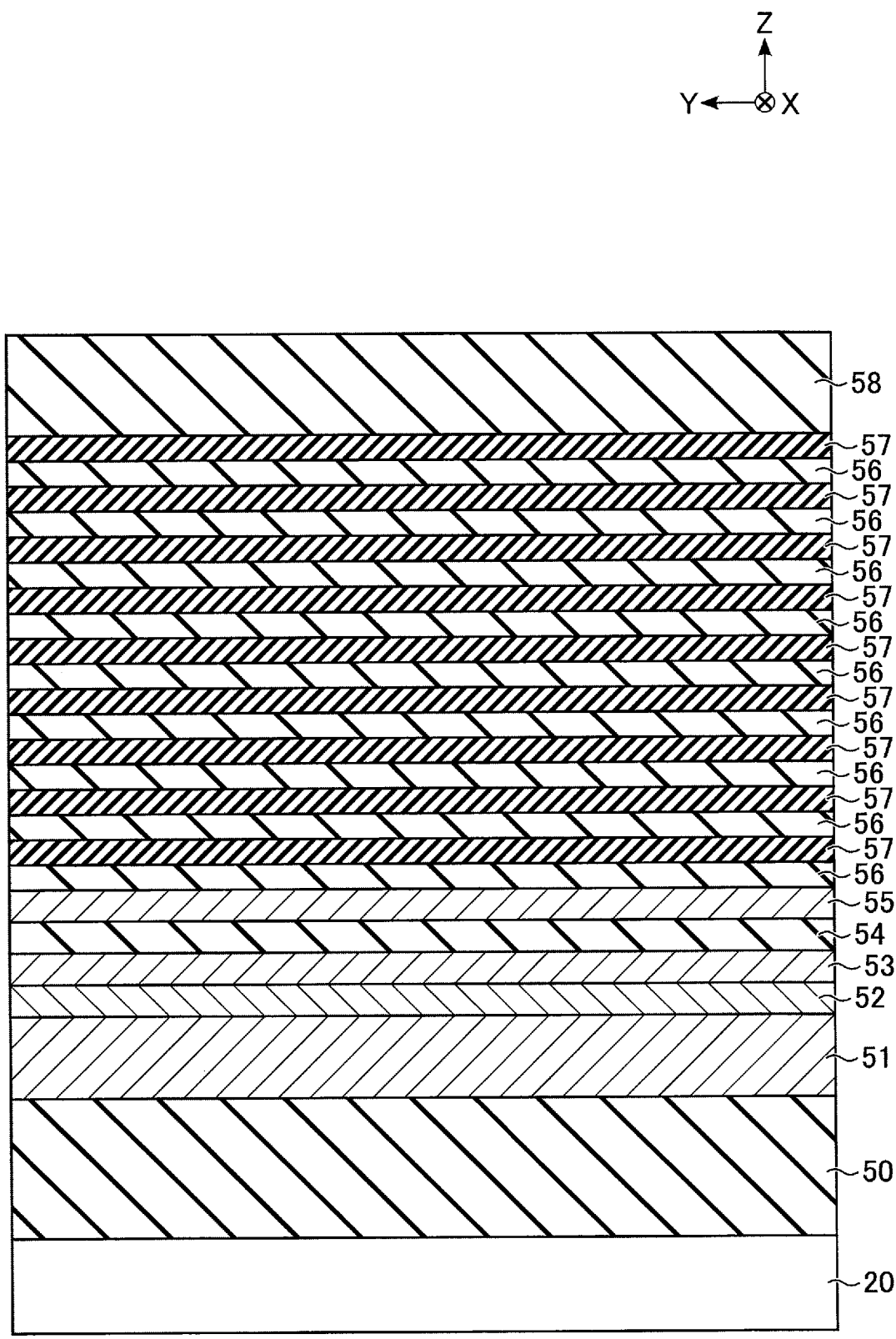
F I G. 10

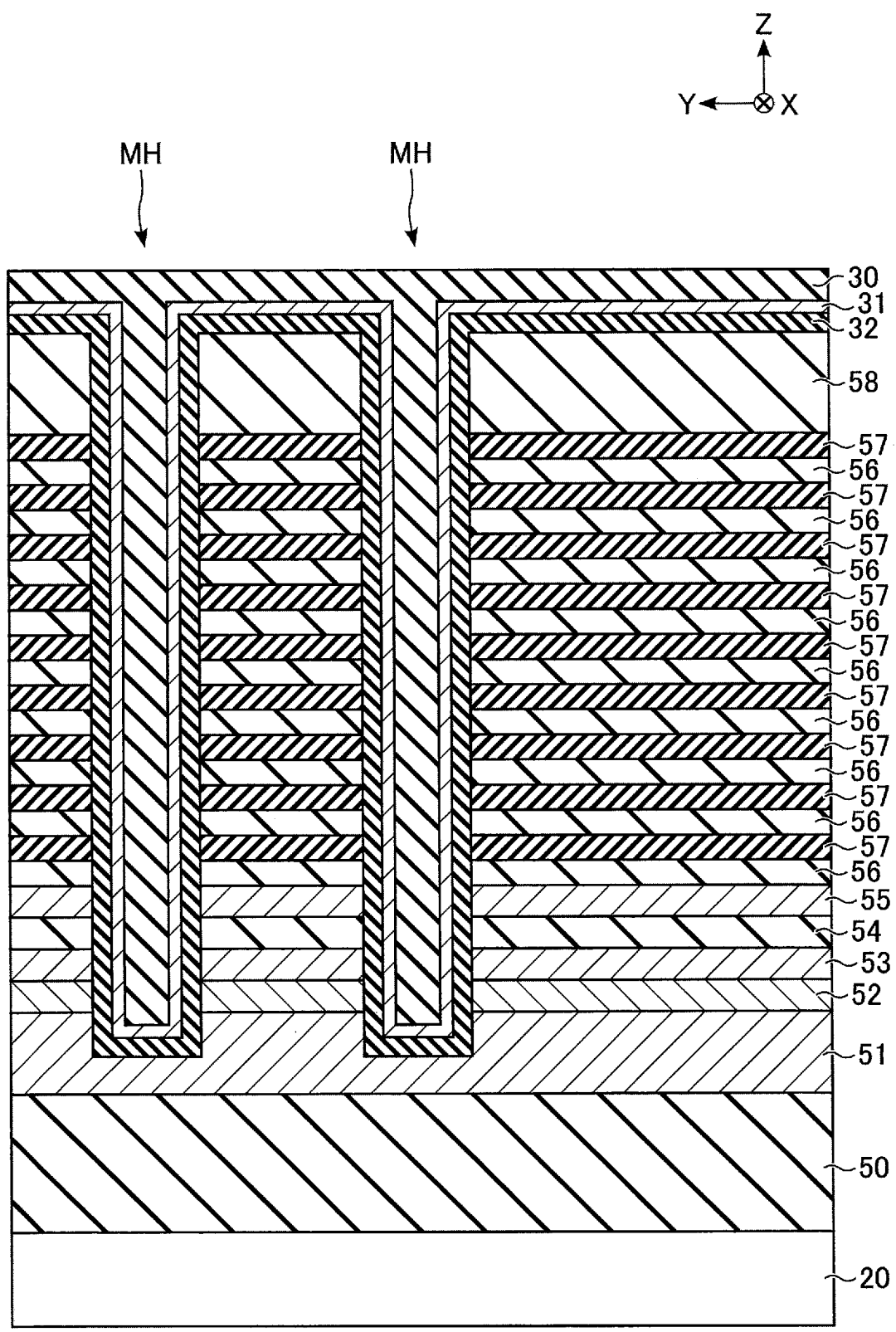
F I G. 12

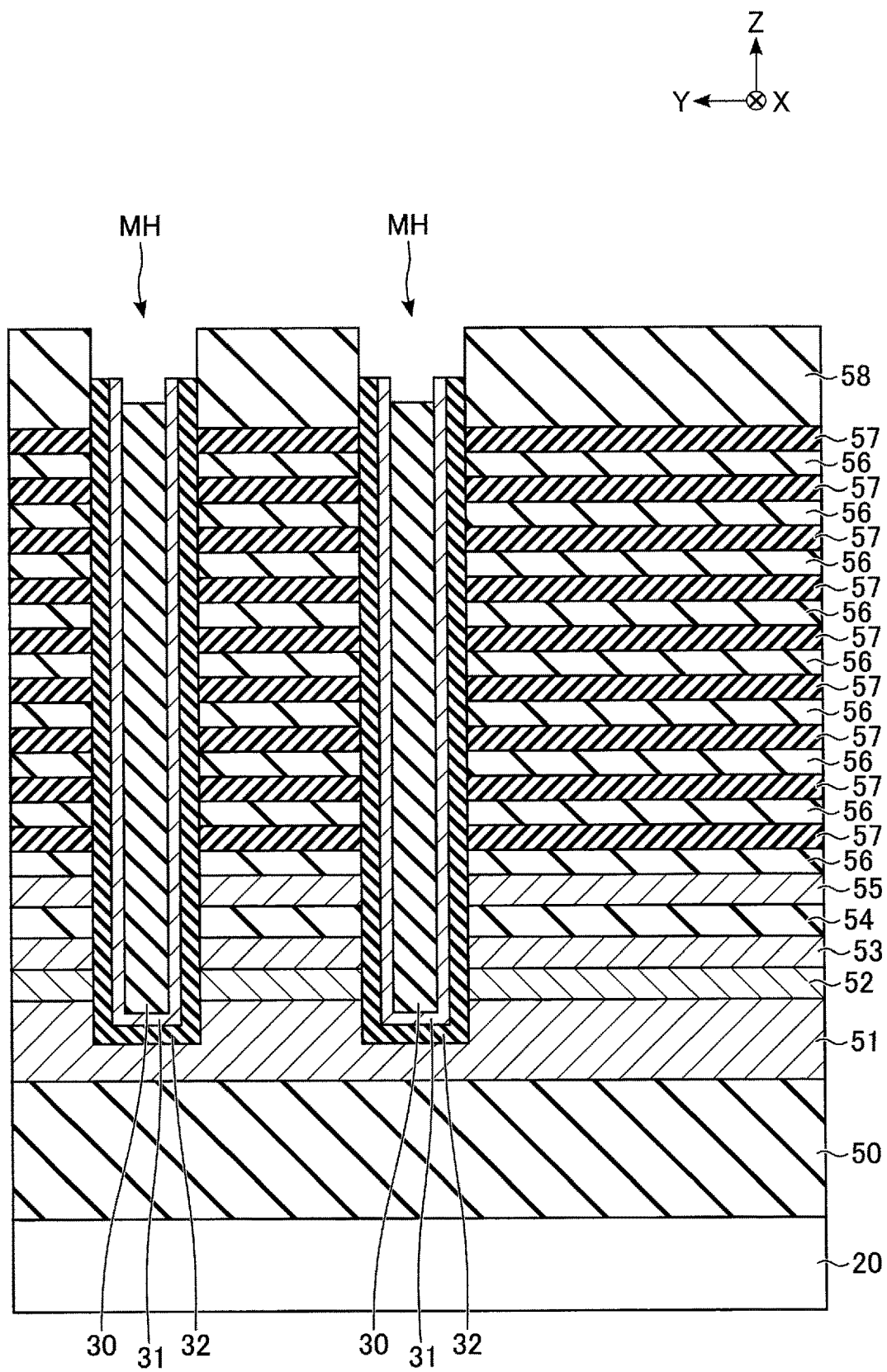
F I G. 13

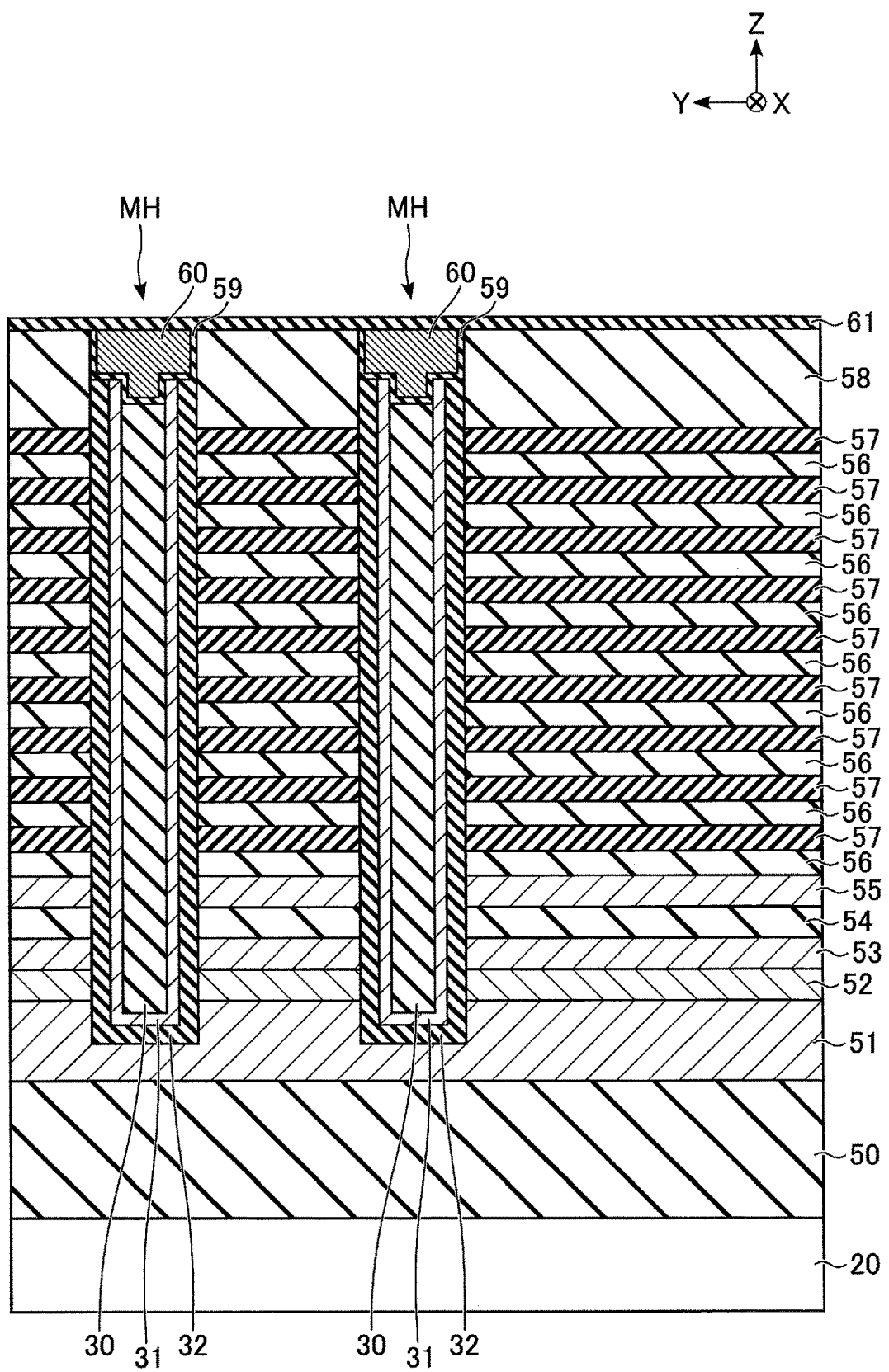
F I G. 14

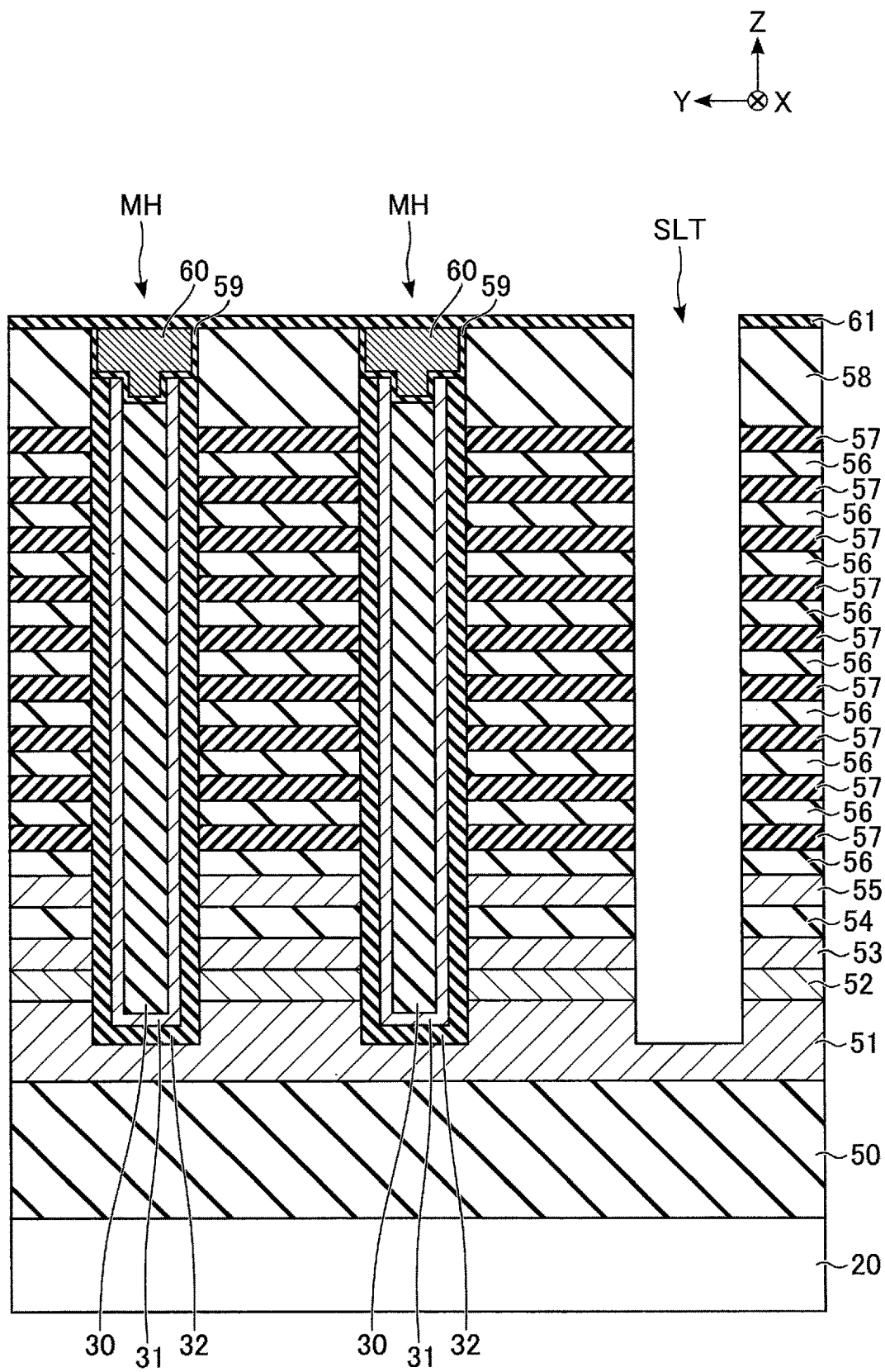
F I G. 15

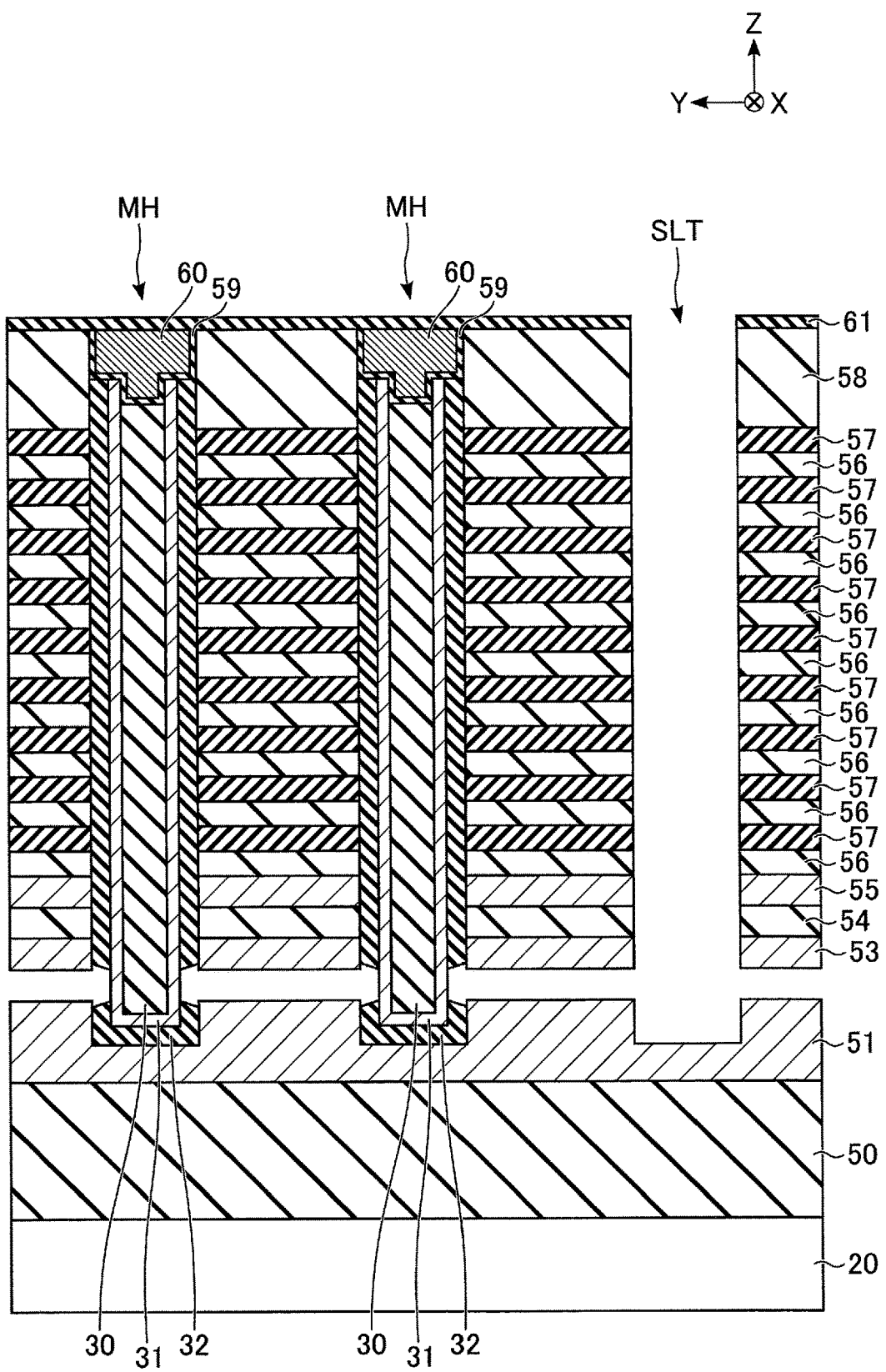
F I G. 16

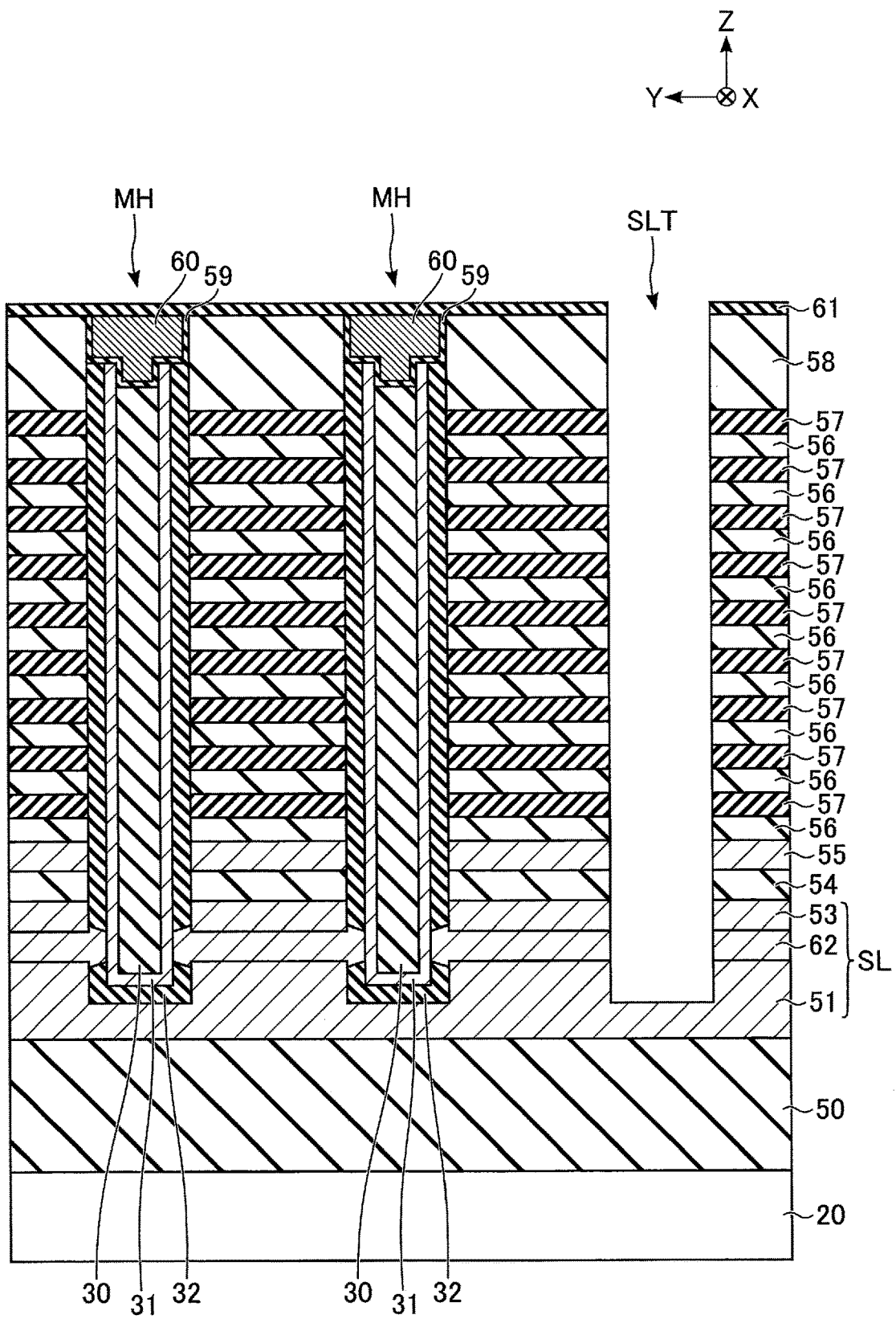
F I G. 17

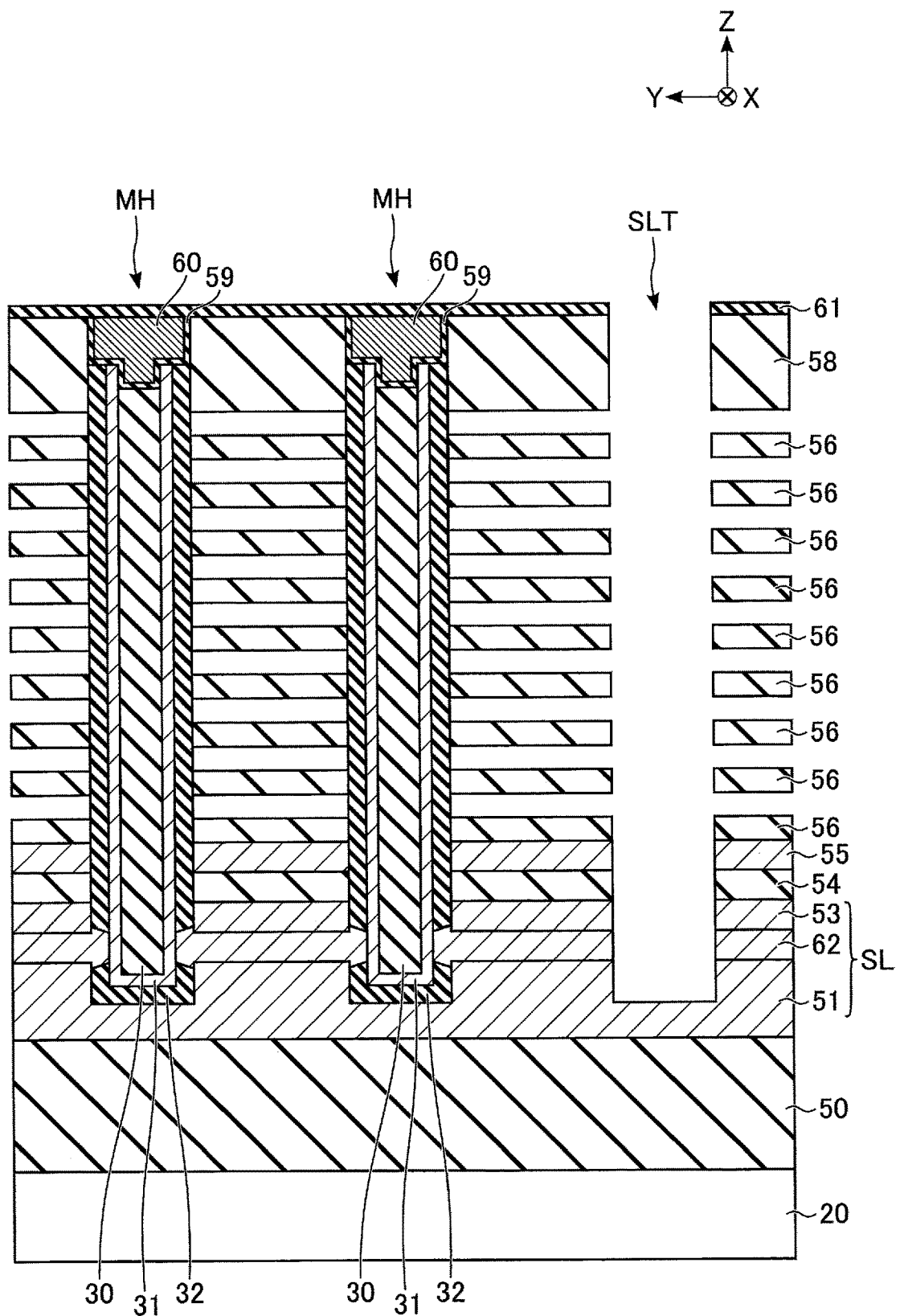
F I G. 18

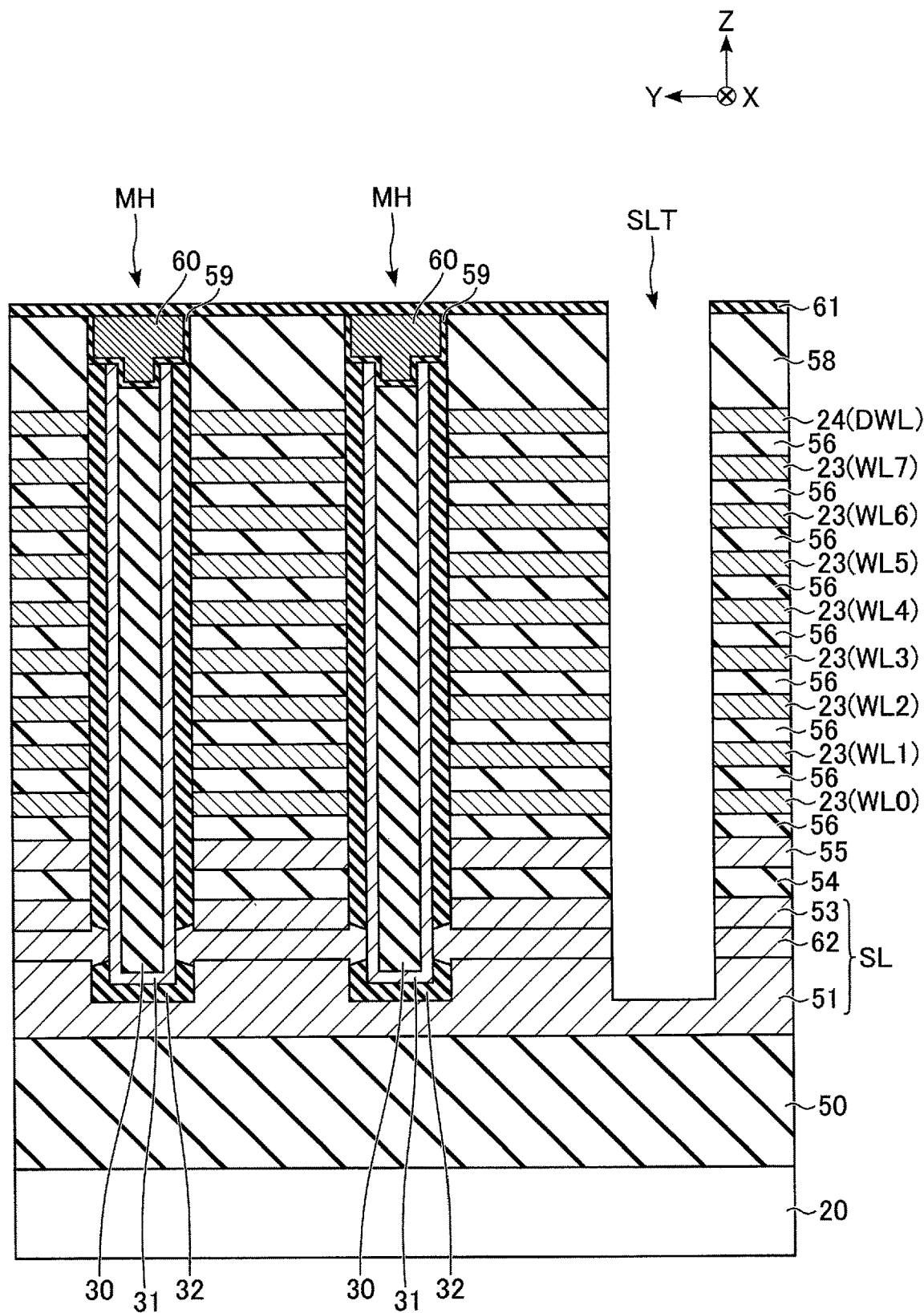
F I G. 19

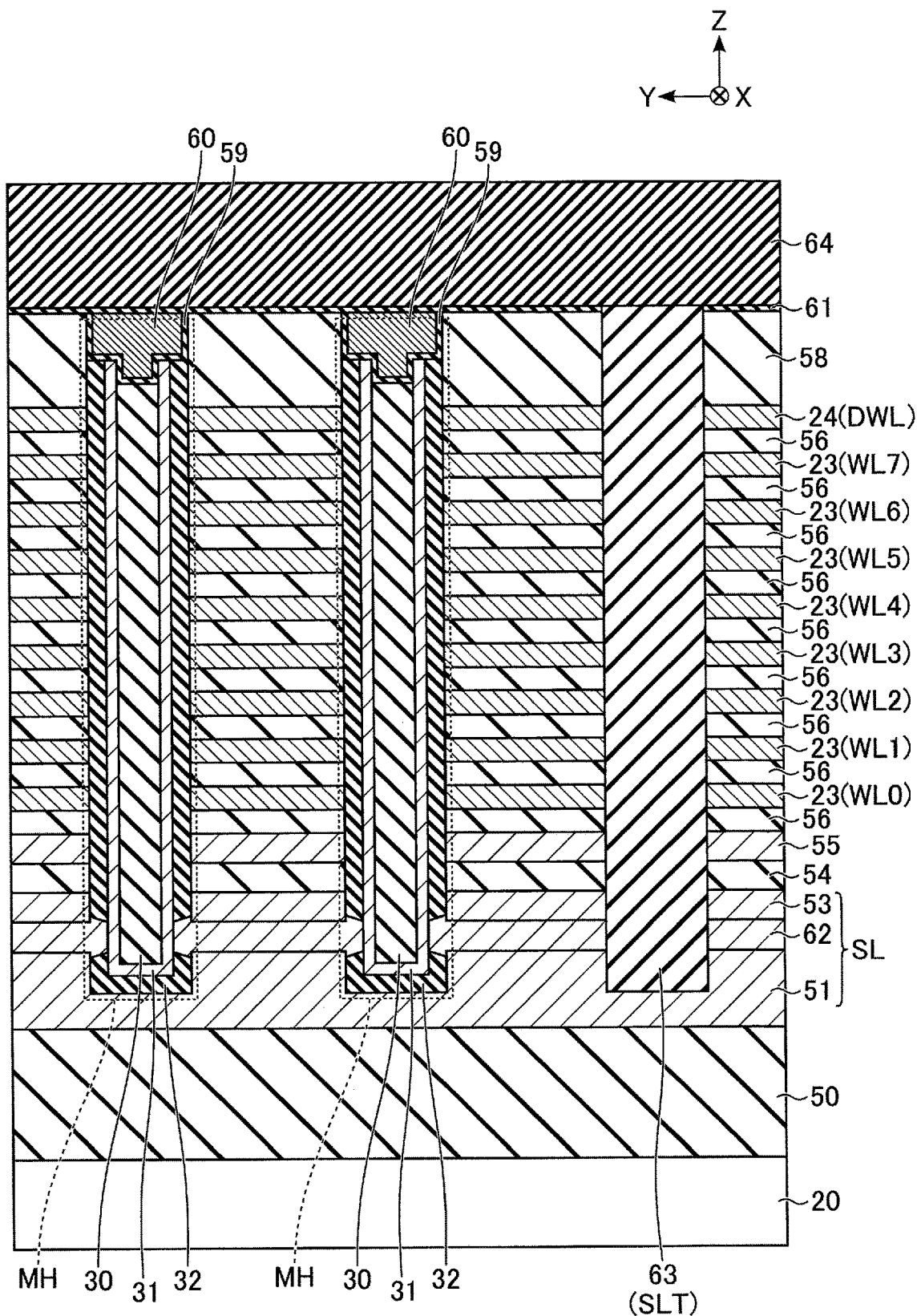
F I G. 21

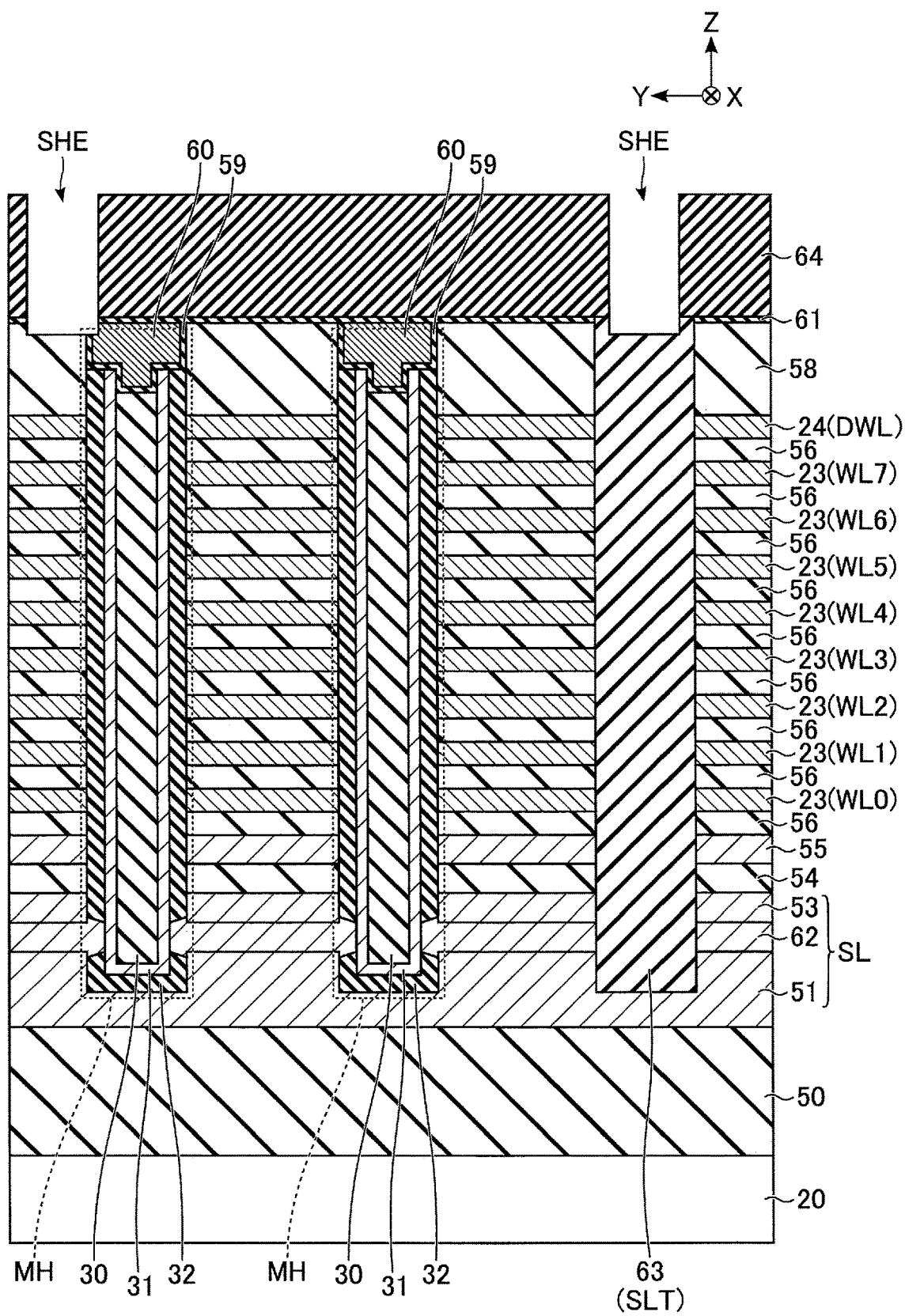
F I G. 22

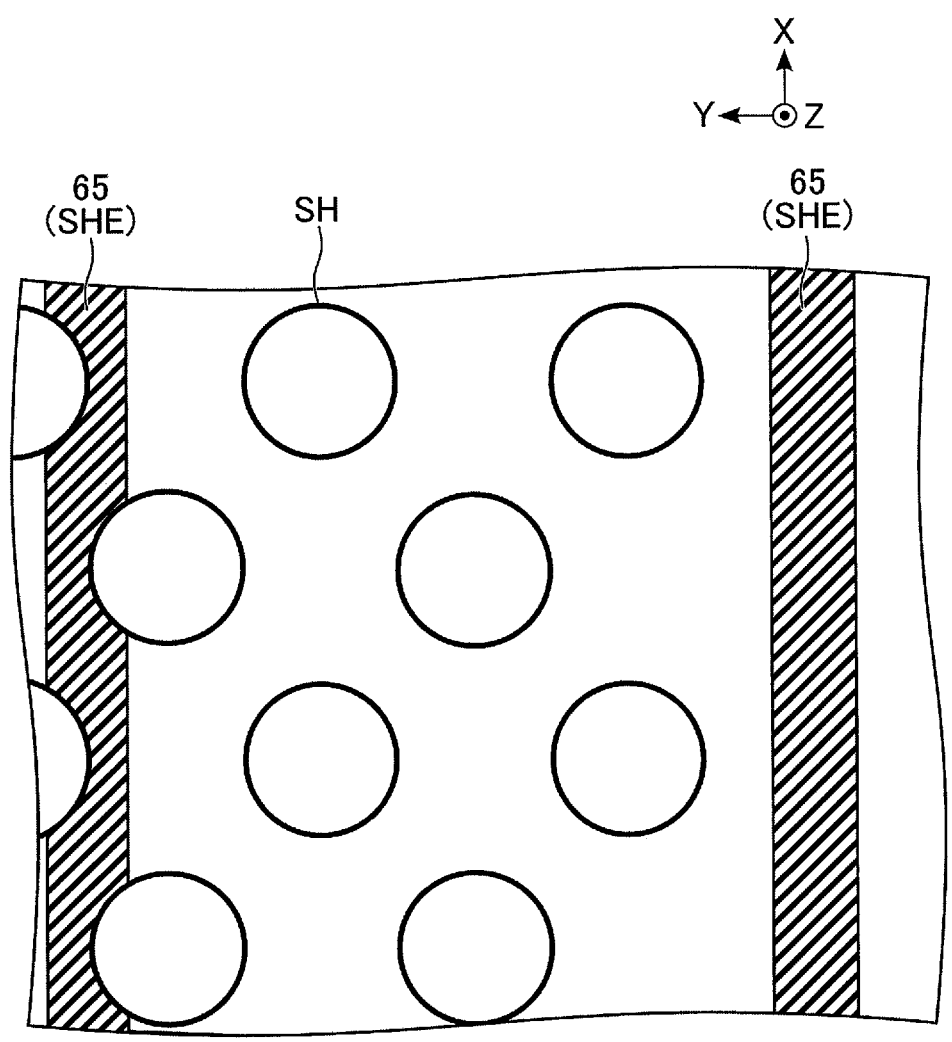
F I G. 24

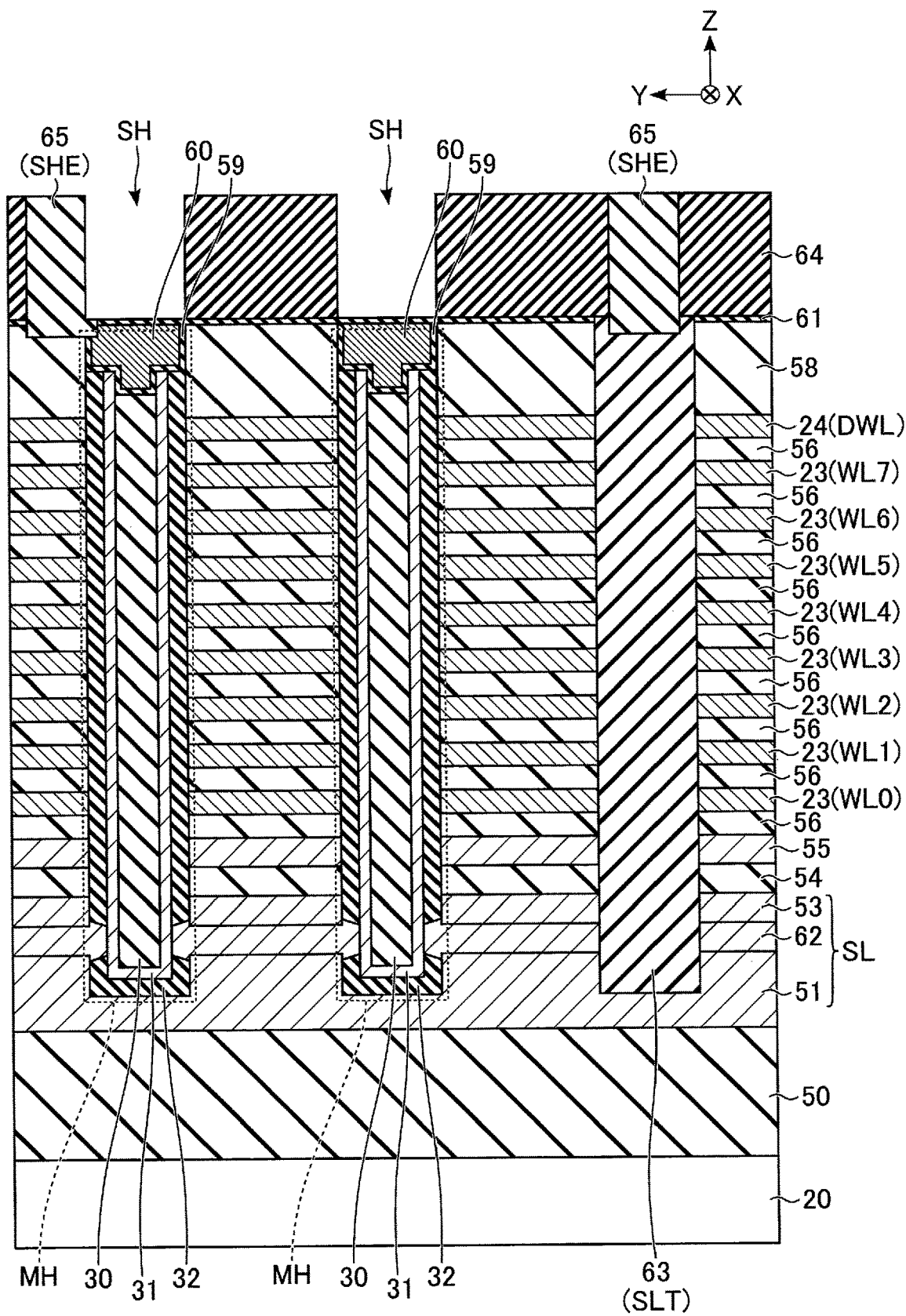
F I G. 25

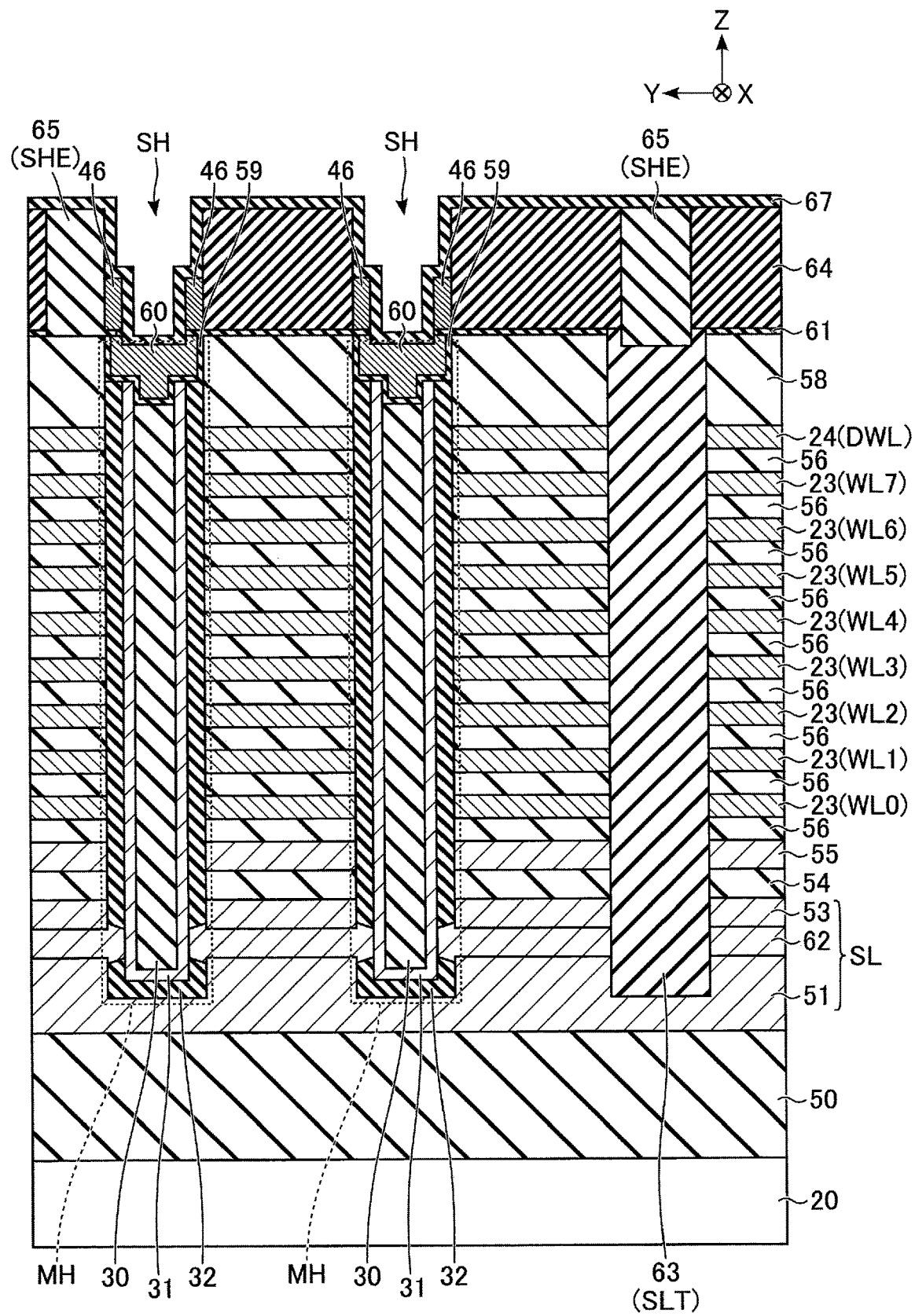
F I G. 27

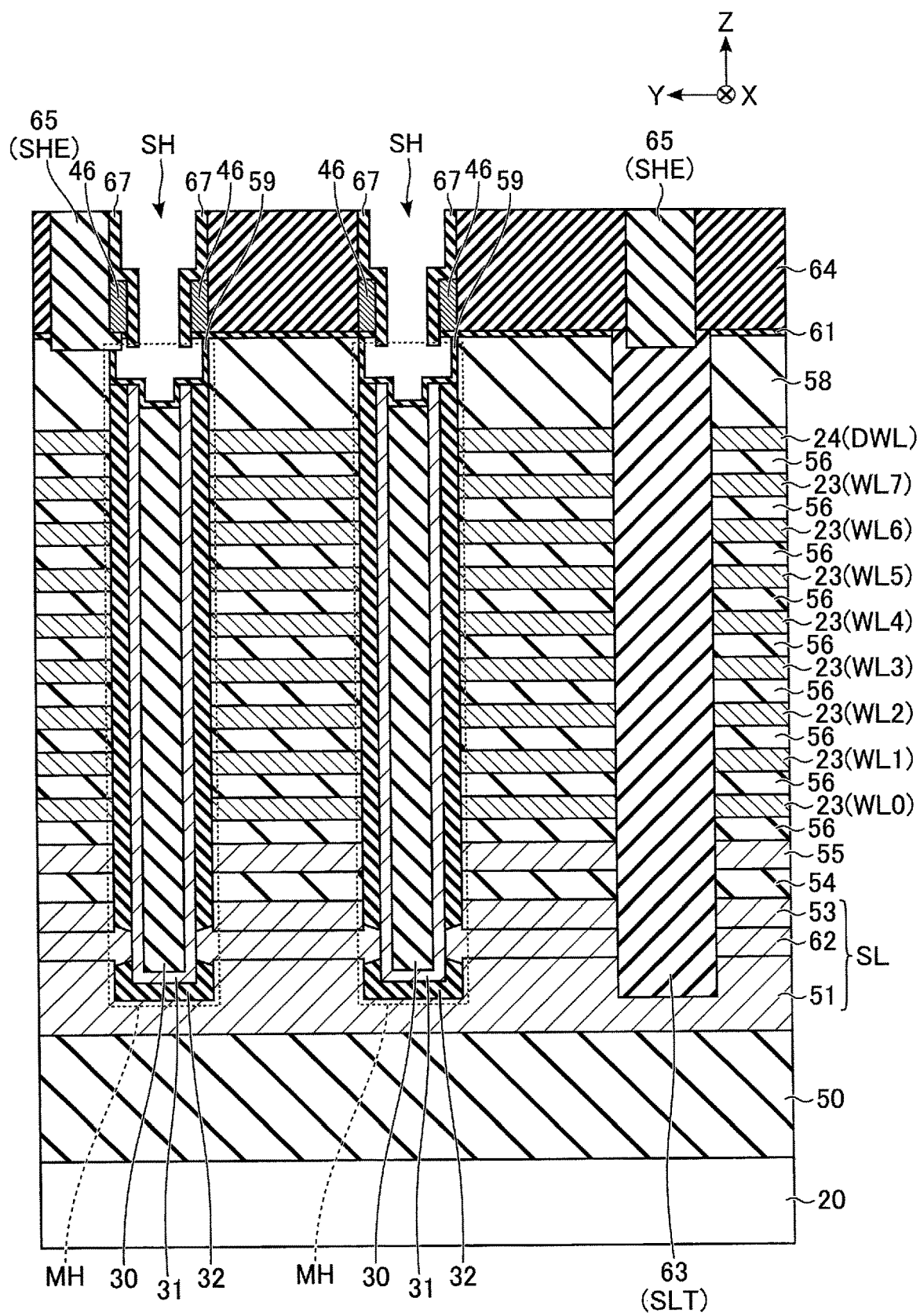
F I G. 29

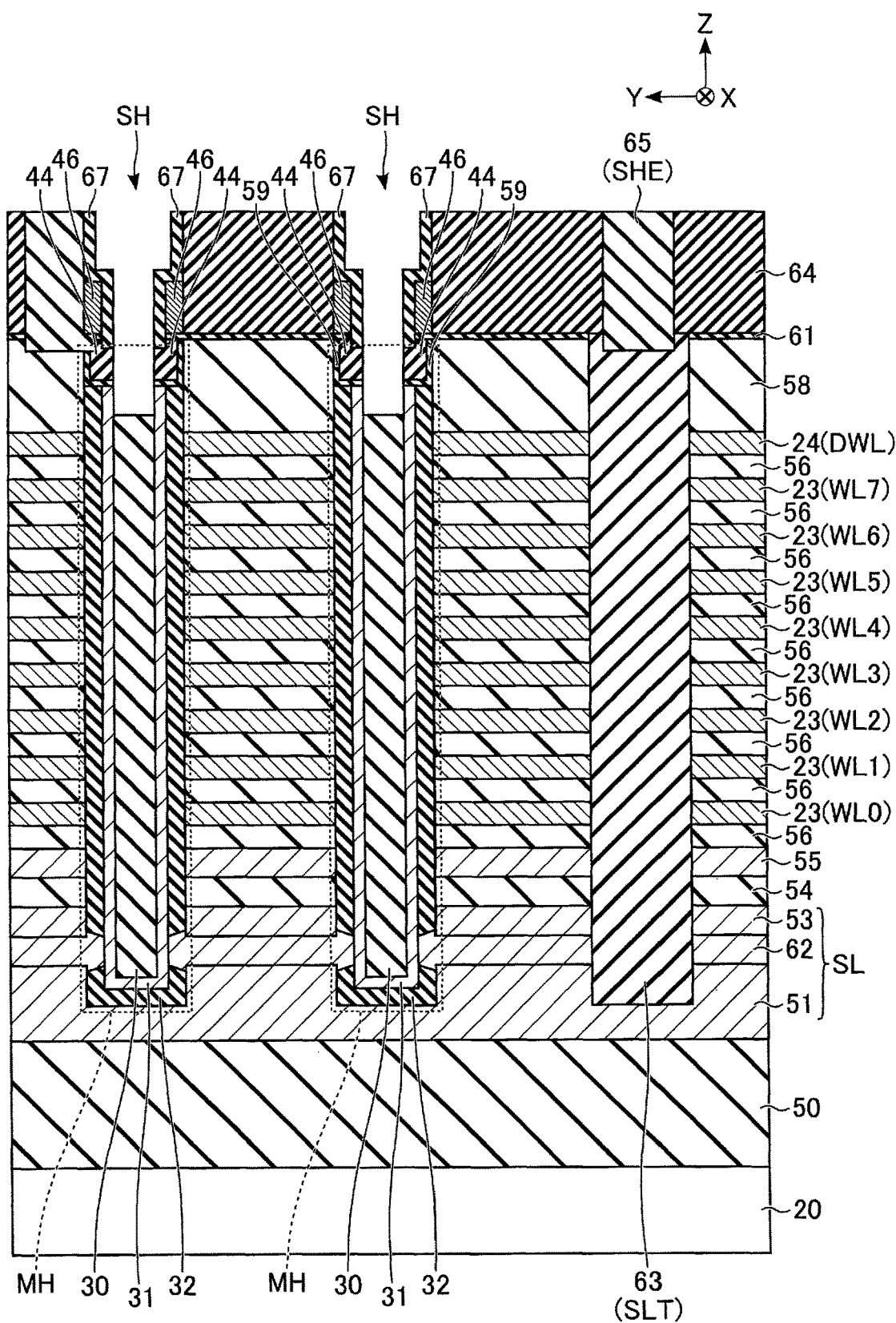
F I G. 31

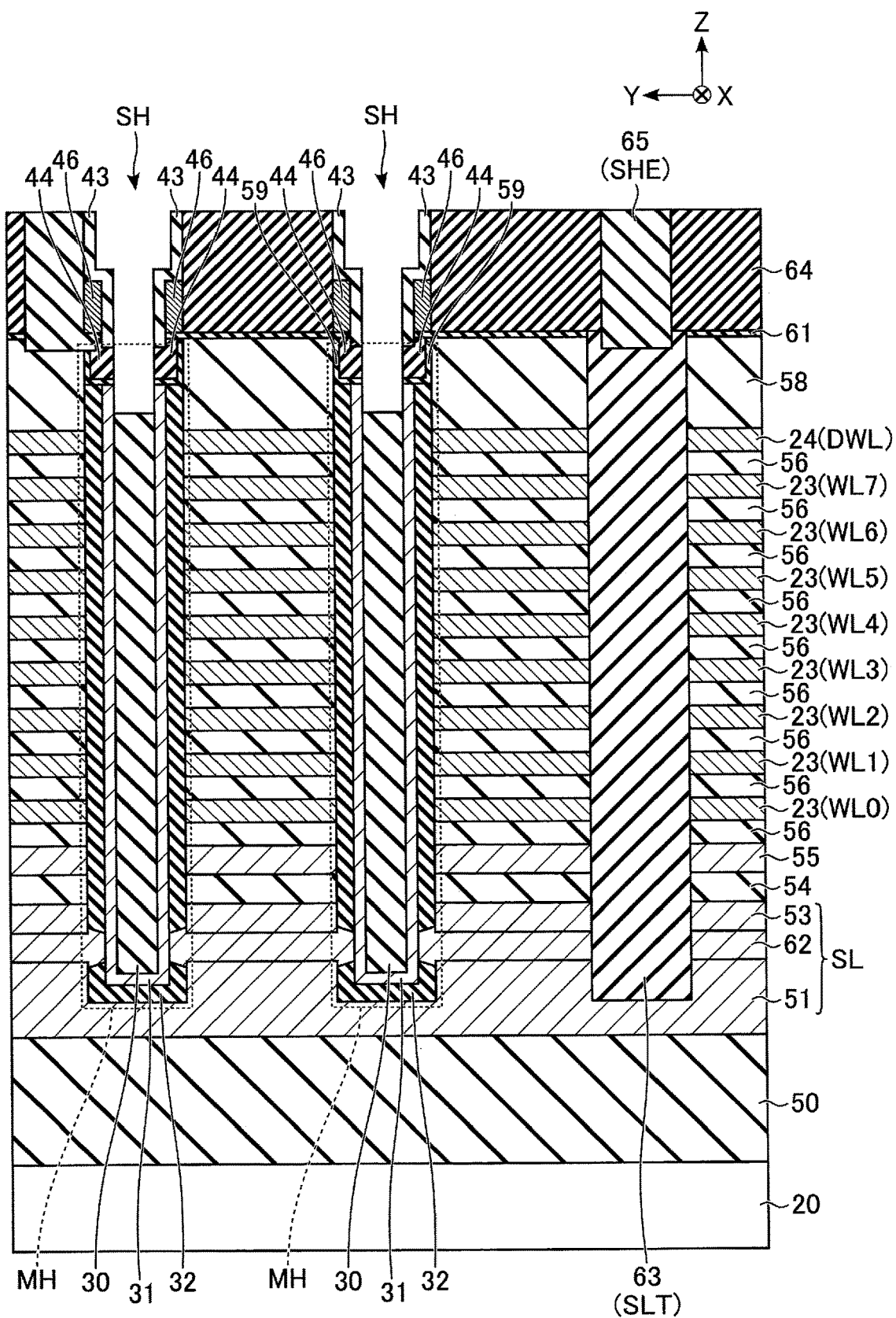
F I G. 32

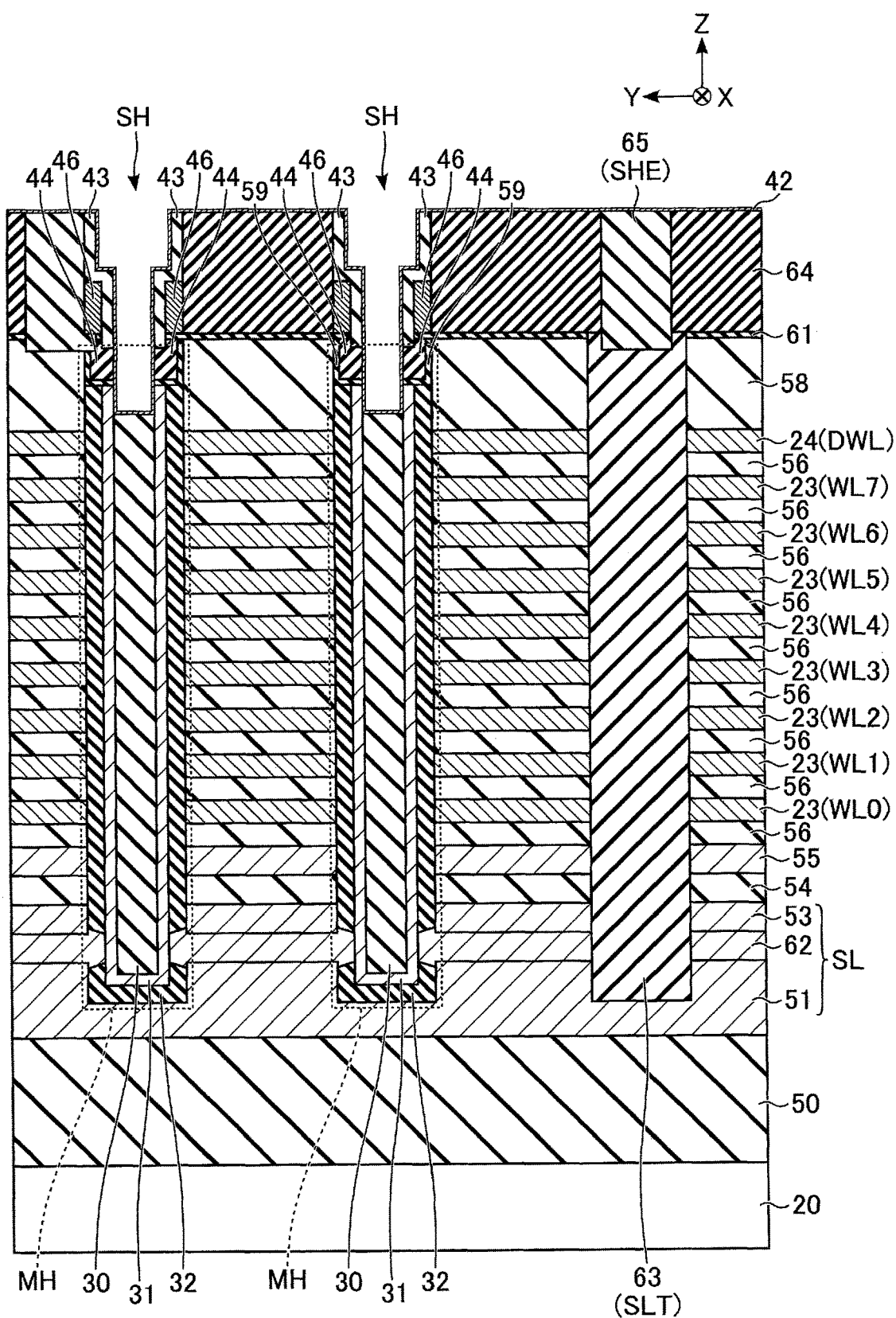
F I G. 33

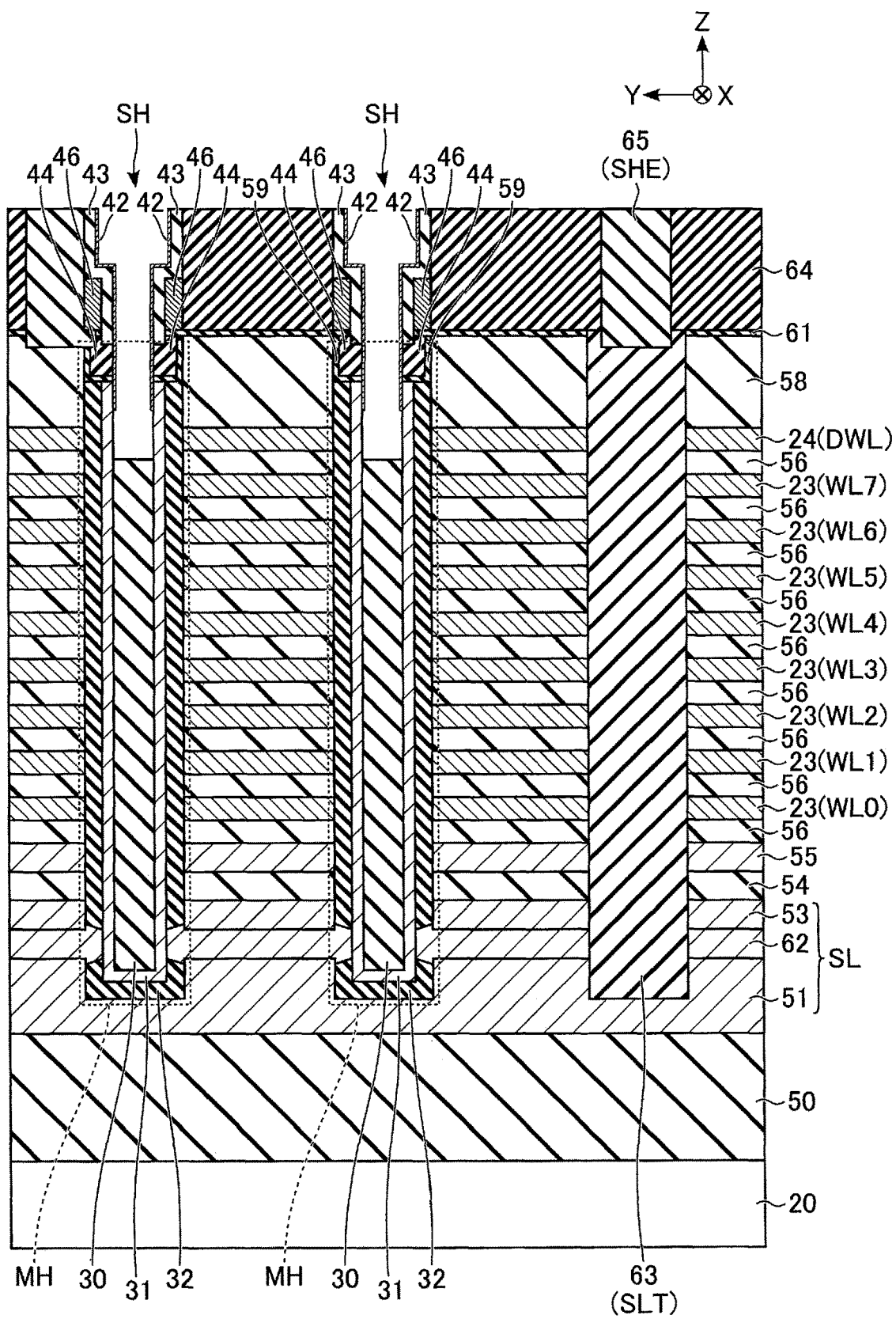
F I G. 34

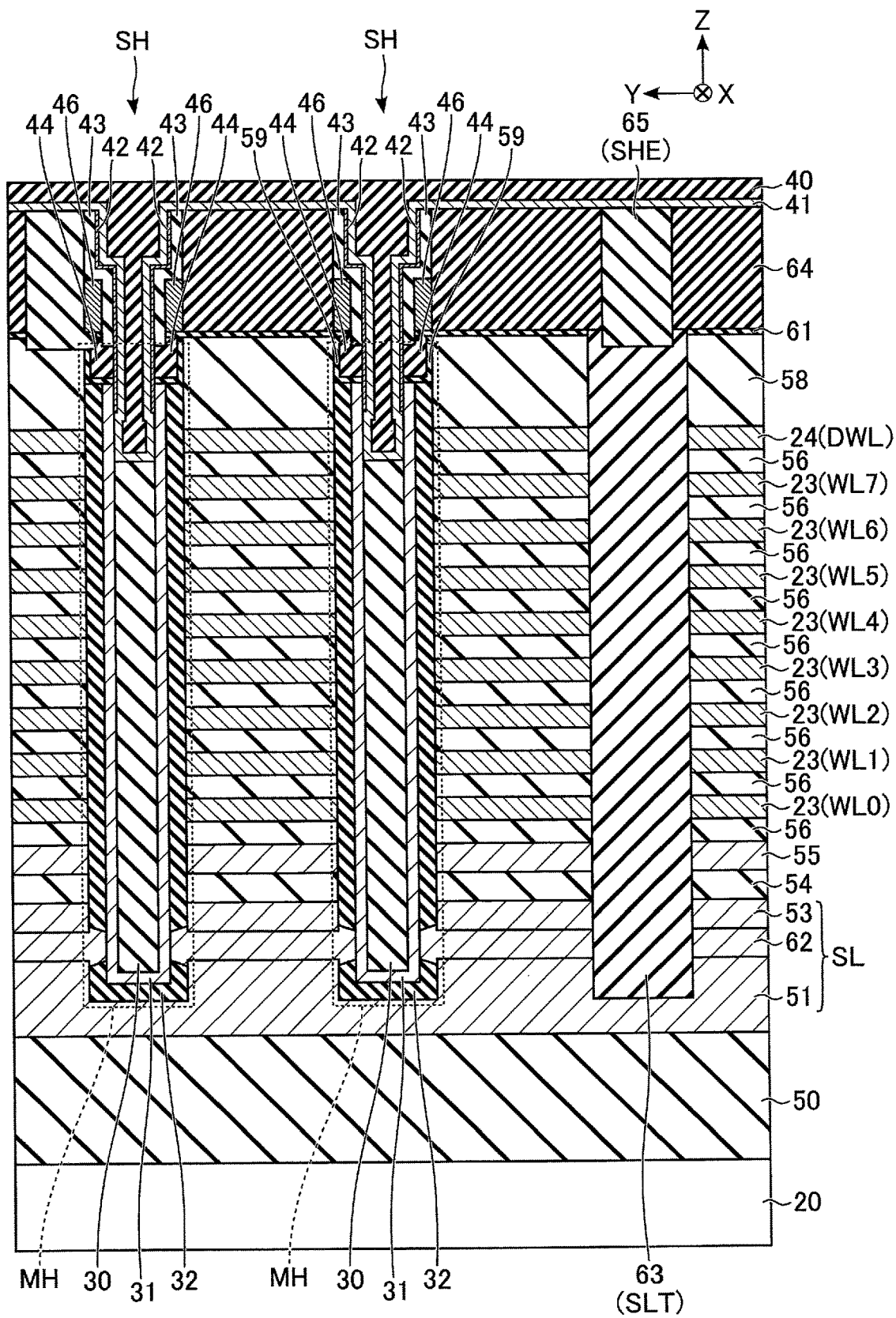
F I G. 35

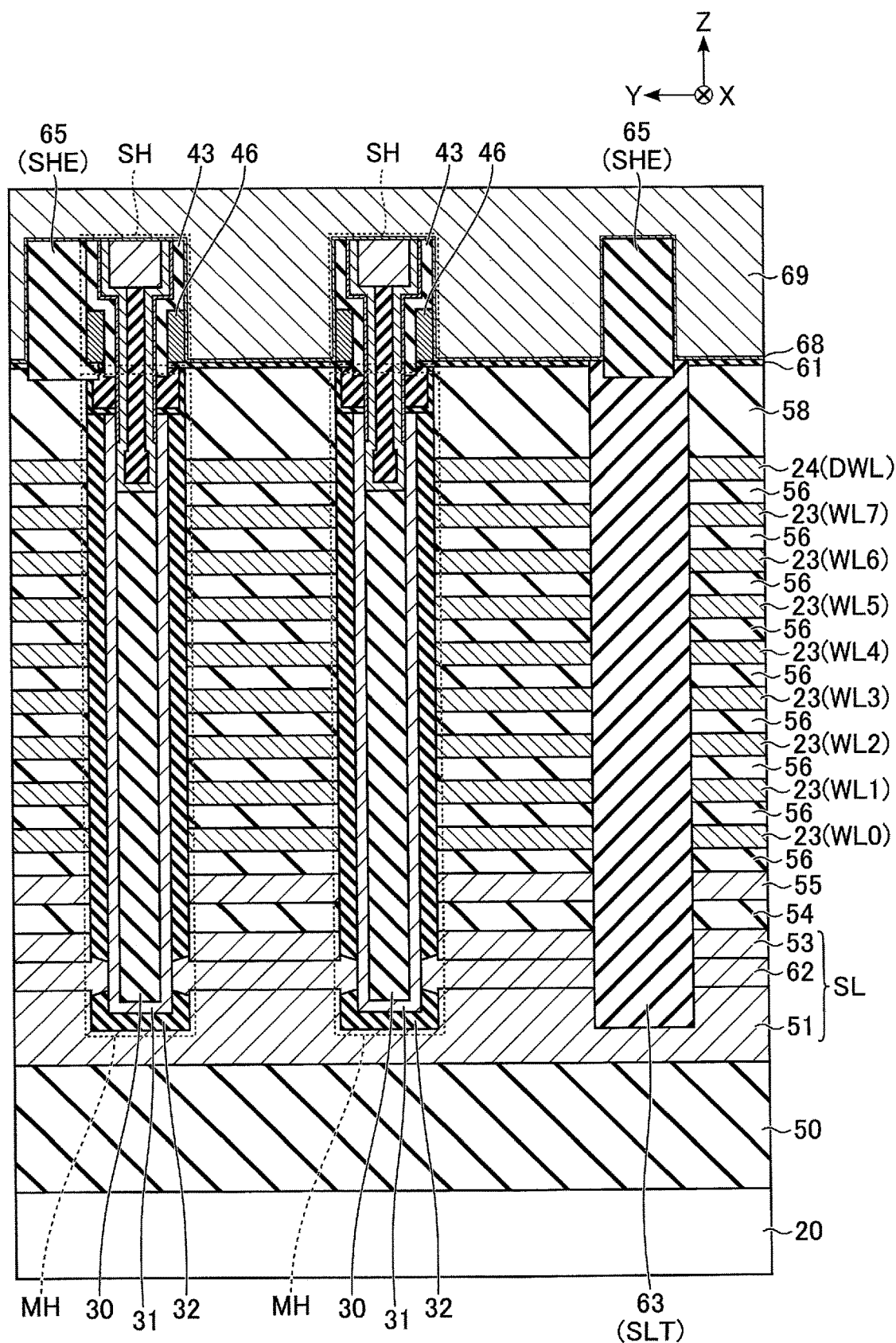
F I G. 37

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2018-156248, filed Aug. 23, 2018, the entire contents of which are incorporated herein by reference.

FIELD

Embodiments described herein relate generally to a semiconductor memory device, and a method of manufacturing the same.

BACKGROUND

NAND flash memories capable of storing data in a nonvolatile manner are known.

BRIEF DESCRIPTION OF THE DRAWINGS

FIGS. 5, 6, 7, and 8 are cross-sectional views illustrating an example of a cross-sectional structure of a memory pillar in the semiconductor memory device according to the embodiment; and FIGS. 9, 10, 11, 12, 13, 14, 15, 16, 17, 18, 19, 20, 21, 22, 23, 24, 25, 26, 27, 28, 29, 30, 31, 32, 33, 34, 35, 36, 37, and 38 are cross-sectional views of the memory cell array, illustrating an example of a manufacturing process of the semiconductor memory device according to the embodiment.

DETAILED DESCRIPTION

Figure 1:
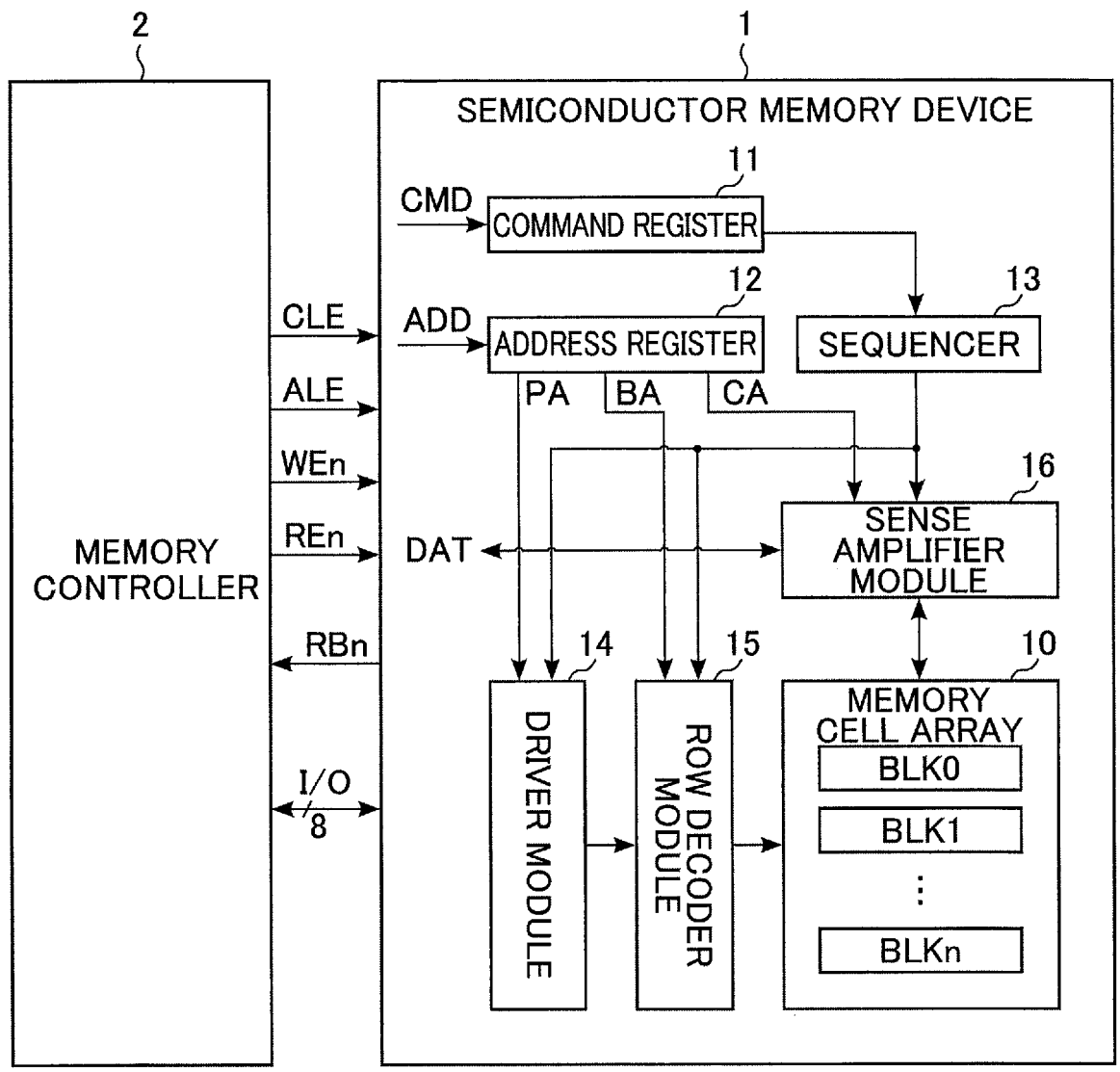
FIG. 1 is a block diagram illustrating a configuration example of a semiconductor memory device according to an embodiment.

In general, according to one embodiment, a semiconductor memory device includes a plurality of first conductive films, a second conductive film, a first pillar including a first semiconductor film and a first insulator, a second semiconductor film, and a second pillar including a second insulator and a third conductive film. The plurality of first conductive films are stacked with respective insulator layers interposed therebetween. The second conductive film is provided above the first conductive films with an insulator layer interposed therebetween. The first semiconductor film penetrate the first conductive films in a stacking direction of the first conductive films. The first insulator is provided on a side surface of the first semiconductor film. The second semiconductor film is provided on the first pillar. The second semiconductor film penetrate the second conductive film in the stacking direction and is electrically connected to the first semiconductor film in the first pillar. The second insulator is provided on a side surface of the second semiconductor film. The third conductive film includes a side surface and an upper surface covered with the second insulator and contacting the second conductive film.

The following is an explanation of an embodiment with reference to drawings. The embodiment illustrates an apparatus and a method to materialize the technical idea of the invention. The drawings are schematic or conceptual, and the dimensions and the ratio of each of the drawings are not always equal to actual ones. The technical idea of the present invention is not specified with the shapes, structures, or arrangement of constituent elements.

In the following explanation, constituent elements having substantially the same functions and structures are denoted by the same reference numerals. The numeral after the characters forming the reference numerals are referred to with reference numerals including the same characters, and used for distinguishing elements having similar structures from each other. When it is unnecessary to mutually distinguish elements indicated with reference numerals including the same characters, these elements are referred to with reference numerals including only the characters.

[1] EMBODIMENTS

The following is an explanation of a semiconductor memory device 1 according to an embodiment.

[1-1] Configuration of Semiconductor Memory Device 1

[1-1-1] Whole Configuration of Semiconductor Memory Device 1

A semiconductor memory device 1 is, for example, a NAND-type flash memory capable of storing data in a nonvolatile manner. The semiconductor memory device 1 is controlled with, for example, an external memory controller 2. FIG. 1 illustrates a configuration example of the semiconductor memory device 1 according to the embodiment.

As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). Each of the blocks BLK is a group of a plurality of memory cells capable of storing data in a nonvolatile manner, and used as, for example, a unit of erasure of data.

The memory cell array 10 is provided with a plurality of bit lines and a plurality of word lines. Each of memory cells is associated with a bit line and a word line. The detailed configuration of the memory cell array 10 will be described later.

The command register 11 retains a command CMD received with the semiconductor memory device 1 from the memory controller 2. The command CMD includes a command to cause, for example, the sequencer 13 to perform a read operation, a write operation, and/or an erase operation, and the like.

The address register 12 retains address information ADD received with the semiconductor memory device 1 from the memory controller 2. The address information ADD includes, for example, a block address BA, a page address PA, and a column address CA. For example, the block address BA, the page address PA, and the column address CA are used for selection of the block BLK, the word line, and the bit line, respectively.

The sequencer 13 controls operations of the whole semiconductor memory device 1. For example, the sequencer 13 controls the driver module 14, the row decoder module 15, and the sense amplifier 16, and the like, on the basis of the command CMD retained in the command register 11, to perform a read operation, a write operation, and an erase operation, and the like.

The driver module 14 generates voltage used for a read operation, a write operation, and/or an erase operation, and the like. The driver module 14 applies voltage to a signal line corresponding to the selected word line, for example, on the basis of the page address PA retained in the address register 12.

The row decoder module 15 selects a corresponding block BLK in the corresponding memory cell array 10 on the basis of the block address BA retained in the address register 12. The row decoder module 15 transfers the voltage applied to the signal line corresponding to, for example, the selected word line to the selected word line in the selected block BLK.

In a write operation, the sense amplifier module 16 applies desired voltage to each bit line in accordance with write data DAT received from the memory controller 2. In a read operation, the sense amplifier module 16 determines data stored in the memory cell on the basis of the voltage of the bit line, and transfers a determination result as read data DAT to the memory controller 2.

Communications between the semiconductor memory 1 and the memory controller 2 support, for example, the NAND interface standard. For example, in communications between the semiconductor memory device 1 and the memory controller 2, signals to be used are a command latch enable signal CLE, an address latch enable signal ALE, a write enable signal WEn, a read enable signal REn, a ready busy signal RBn, and an input/output signal I/O.

The command latch enable signal CLE is a signal indicating that the input/output signal I/O received with the semiconductor memory device 1 is a command CMD. The address latch enable signal ALE is a signal indicating that the signal I/O received with the semiconductor memory device 1 is address information ADD. The write enable signal WEn is a signal to command the semiconductor memory device 1 to input the input/output signal I/O. The read enable signal REn is a signal to command the semiconductor memory device 1 to output the input/output signal I/O.

The ready busy signal RBn is a signal for notifying the memory controller 2 whether the semiconductor memory device 1 is in a ready state to accept a command from the memory controller 2 or in a busy state in which command is accepted. The input/output signal r/O is, for example, a signal of a 8-bit width, and may include a command CMD, address information ADD, and data DAT, and the like.

The semiconductor memory device 1 and the memory controller 2 described above may form one semiconductor device with a combination thereof. Examples of such a semiconductor device include a memory card, such as a SD™ card, and a solid state drive (SSD).

[1-1-2] Circuit Configuration of Memory Cell Array 10

Figure 2:
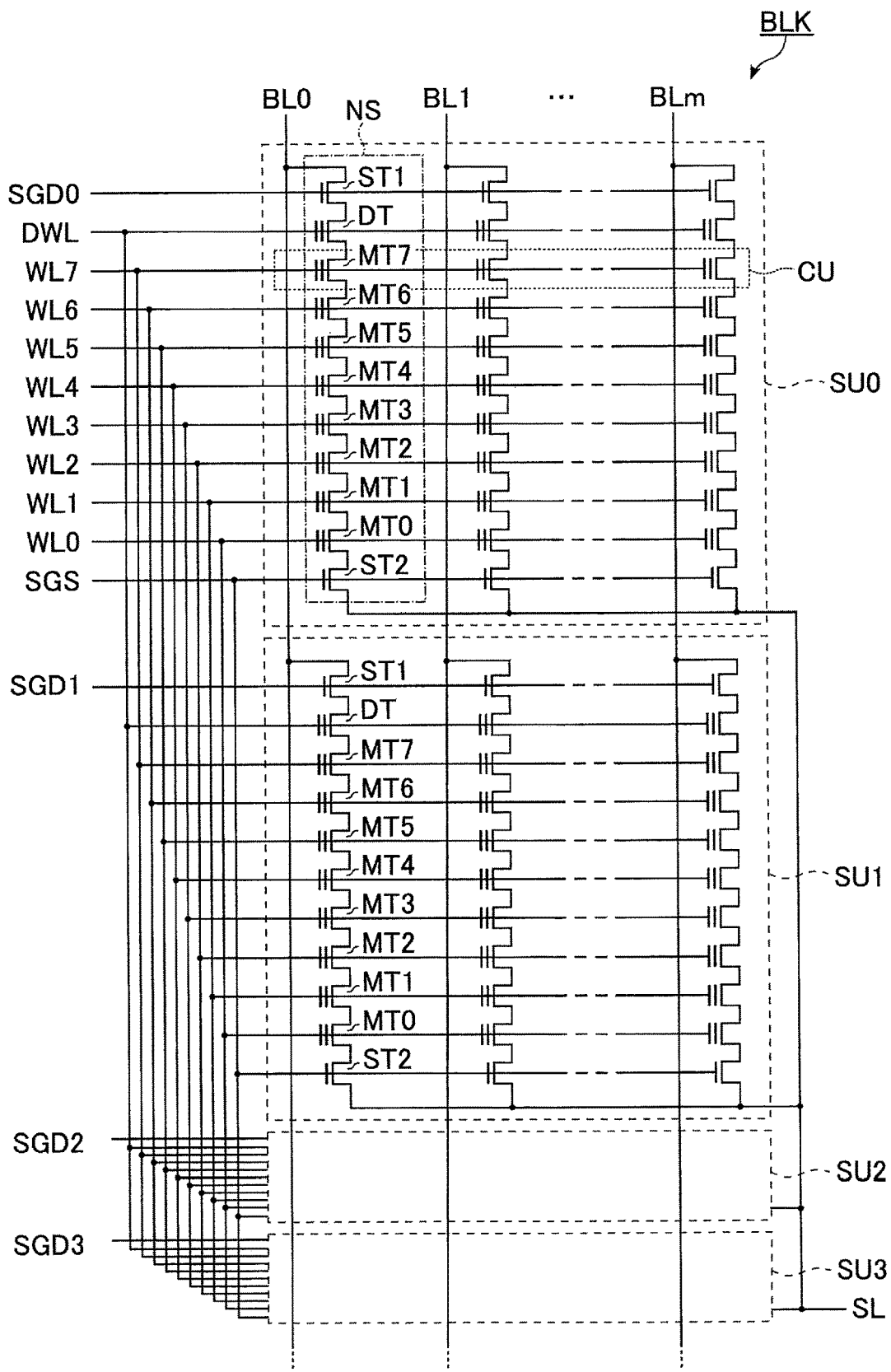
FIG. 2 is a circuit diagram illustrating an example of circuit configuration of a memory cell array included in the semiconductor memory device according to the embodiment.

FIG. 2 illustrates an example of circuit configuration of the memory cell array 10 included in the semiconductor memory device 1 according to the embodiment, in which one block BLK in a plurality of blocks BLK included in the memory cell array 10 is extracted.

As illustrated in FIG. 2, the block BLK includes, for example, four string units SU0 to SU3. Each of the string units SU includes a plurality of NAND strings NS.

The NAND strings NS are associated with respective bit lines BL0 to BLm (m is an integer of 1 or more). Each of the NAND strings NS includes, for example, memory cell transistors MT0 to MT7, a dummy transistor DT, and select transistors ST1 and ST2.

Each of the memory cell transistors MT includes a control gate and a charge accumulation layer, and retains data in a nonvolatile manner. The dummy transistor DT includes, for example, a structure similar to that of the memory cell transistor MT, and is not used for storage of data. Each of the select transistors ST1 and ST2 is used for selection of the string unit SU in various operations.

In each of the NAND strings NS, a drain of the select transistor ST1 is connected to the associated bit line BL. A source of the select transistors ST1 is connected to a drain of the dummy transistor DT.

A source of the dummy transistor DT is connected to one ends of the memory cell transistors MT0 to MT7 connected in series. The other ends of the memory cell transistors MT0 to MT7 connected in series are connected to a drain of the select transistor ST2. A source of the select transistor ST2 is commonly connected to the source line SL in the same block BLK.

In the same block BLK, control gates of the memory cell transistors MT0 to MT7 are commonly connected to the word lines WL0 to WL7, respectively. Control gates of the dummy transistors DT are commonly connected to a dummy word line DWL.

Gates of the select transistors ST1 in the string units SU0 to SU3 are commonly connected to select gate lines SGD0 to SGD3, respectively. Gates of the select transistors ST2 are commonly connected to a select gate line SGS.

In the circuit configuration of the memory cell array 10 described above, each of the bit lines BL is commonly connected to, for example, a plurality of corresponding NAND strings NS in each block BLK. The source line SL is commonly connected to, for example, a plurality of blocks BLK.

A group of a plurality of memory cell transistors MT connected to a common word line WL in one string unit SU is referred to as, for example, cell unit CU. For example, a storage capacity of the cell unit CU included memory cell transistors MT each storing 1-bit data is defined as "1-page data". The cell unit CU may have a storage capacity of 2-page data or more, in accordance with the number of bits of data stored in each memory cell transistor MT.

The circuit configuration of the memory cell array 10 included in the semiconductor memory device 1 according to the embodiment is not limited to the configuration described above. For example, the numbers of the memory cell transistors MT, the dummy transistor DT, and the select transistors ST1 and ST2 included in each of the NAND strings NS may be designed to any numbers. The number of string units SU included in each of the blocks BLK may be designed to any number.

[1-1-3] Configuration of Memory Cell Array 10

The following is an explanation of configuration of the memory cell array 10 according to the embodiment.

In the drawings referred to hereinafter, the X-direction corresponds to an extending direction of the word lines WL. The Y direction corresponds to an extending direction of the bit lines BL. The Z direction corresponds to a vertical direction with respect to the surface of a semiconductor substrate 20 on which the semiconductor memory device 1 is formed.

In the cross-sectional views referred to hereinafter, constituent elements, such as an insulator layer (interlayer insulator film), a wiring, and a contact, are properly omitted to make the drawing easy to look. In addition, the plan views are properly hatched to make the drawing easy to look. Hatching added to the plan views is not always related to the material or the characteristic of the hatched constituent elements.

Figure 3:
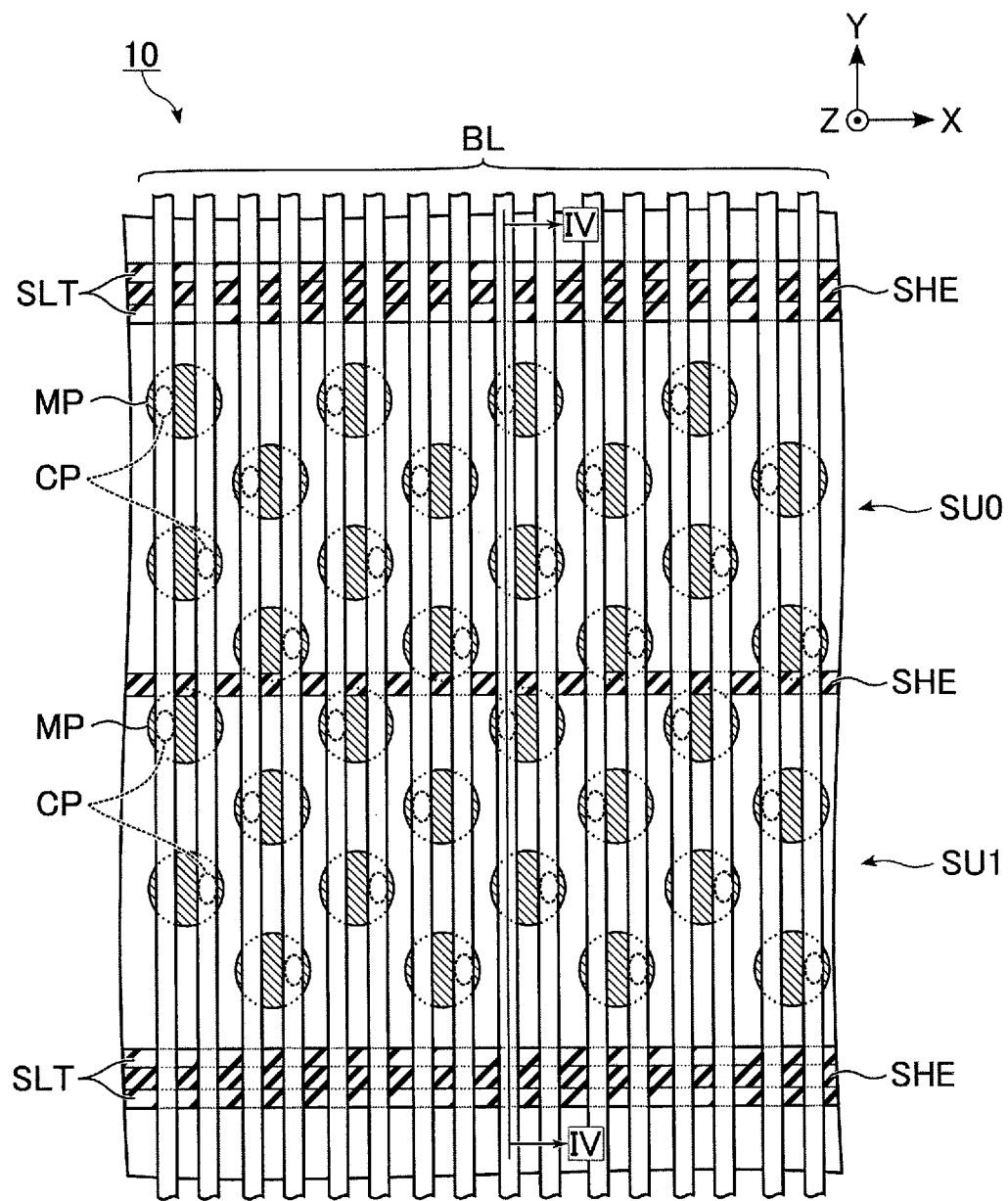
FIG. 3 is a plan view illustrating an example of a plan layout of the memory cell array included in the semiconductor memory device according to the embodiment.

FIG. 3 illustrates an example of a plan layout of the memory cell array 10 included in the semiconductor memory device 1 according to the embodiment, in which structures corresponding to the string units SU0 and SU1 are extracted.

As illustrated in FIG. 3, the region in which the memory cell array 10 is formed includes, for example, a plurality of slits SLT, a plurality of slits SHE, and a plurality of bit lines BL.

The slits SLT divide each of conductive films corresponding to the word lines WL and the select gate lines SGS described later. The slits SHE divide conductive films corresponding to the select gate lines SGD described later. Each of the slits SLT and the SHE includes an insulator.

The slits SLT extend in the X direction and are arranged in the Y direction. The slit SHE extending in the X direction is disposed between the slits SLT adjacent in the Y direction. The slit SHE extending in the X direction, for example, overlaps each of the slits SLT. In this example, the structure corresponding to a part between the slits SHE adjacent in the Y direction corresponds to one string unit SU.

In other words, the string units SU0 and SU1 extend in the X direction and are arranged in the Y direction. The string units SU0 and SU1 are arranged between two slits SLT, that is, between two slits SHE. A slit SHE is disposed between the string units SU0 and SU1 adjacent in the Y direction.

Each of the string units SU includes a plurality of memory pillars MP. Each of the memory pillars MP functions as, for example, one NAND string NS. For example, the memory pillars MP are arranged in a zigzag manner in the XY directions. In each of the string units SU0 and SU1, each of the memory pillars MP arranged in the vicinity of the slit SHE has, for example, a portion overlapping the slit SHE.

The bit lines BL extend in the Y direction and are arranged in the X direction. Each of the bit lines BL is disposed to overlap at least one memory pillar MP in each of the string units SU. For example, in FIG. 3, each of the bit lines BL is disposed on two memory pillars MP in each of the string units SU0 and SU1. As described above, as viewed from each of the memory pillars MP, the bit lines BL are arranged such that two bit lines BL overlap each of the memory pillars MP.

In addition, a contact CP is provided between one bit line BL in the bit lines BL overlapping a memory pillar MP and the memory pillar. Each of the memory pillars MP is electrically connected to the corresponding bit line BL via the contact CP.

The number of string units SU provided between the adjacent slits SLT may be designed to any number. The number and arrangement of the memory pillars MP illustrated in FIG. 3 are a mere example, and the memory pillars MP may be designed to have any number and arrangement. The number of bit lines BL overlapping each of the memory pillars MP may be designed to any number.

Figure 4:
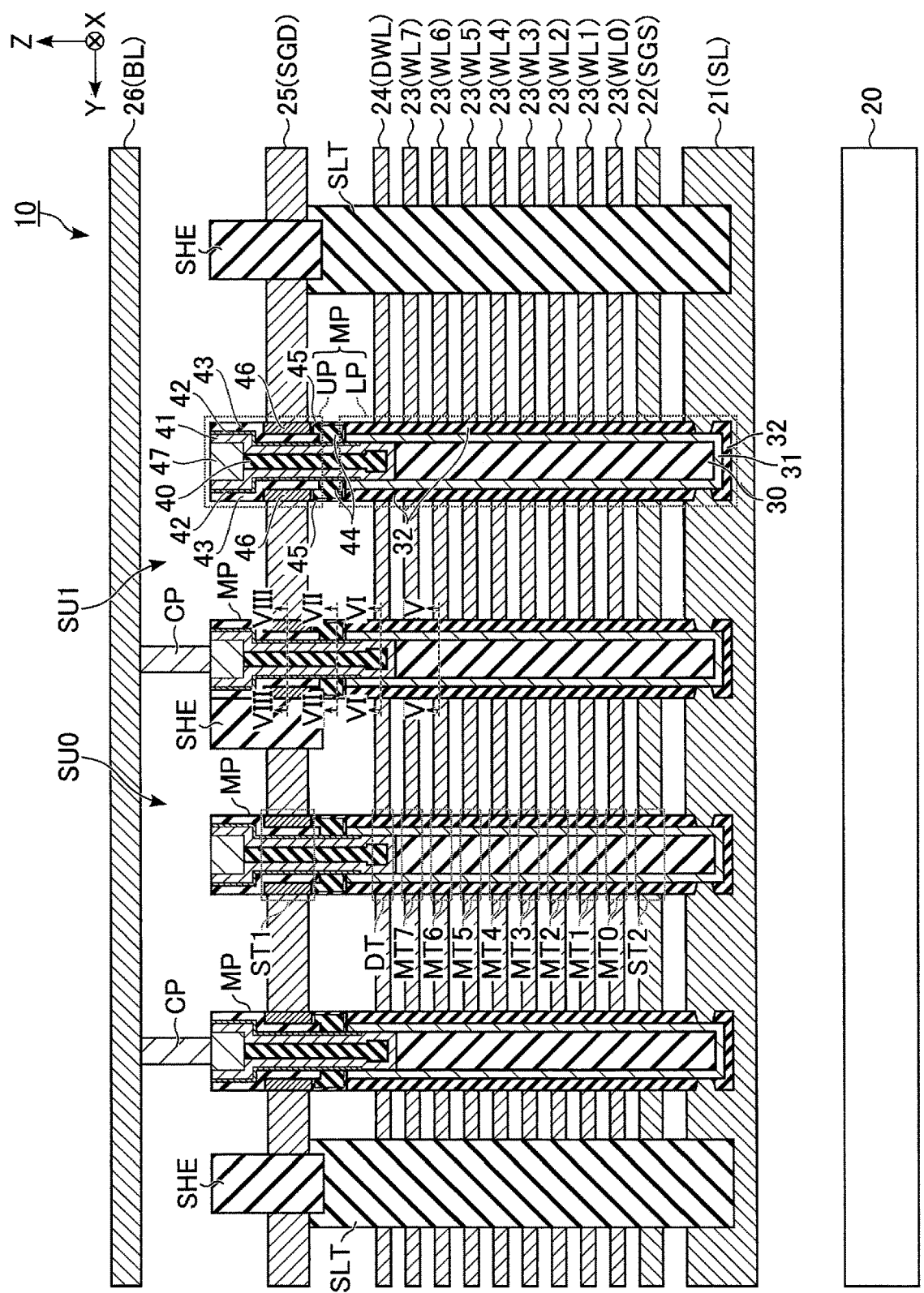
FIG. 4 is a cross-sectional view illustrating an example of a cross-sectional structure of the memory cell array included in the semiconductor memory device according to the embodiment.

FIG. 4 is a cross-sectional view taken along line IV-IV of FIG. 3, and illustrates an example of a cross-sectional structure of the memory cell array 10 included in the semiconductor memory device 1 according to the embodiment.

As illustrated in FIG. 4, the region in which the memory cell array 10 is formed includes, for example, conductive films 21 to 26, the memory pillars MP, the contacts CP, the slits SLT, and the slits SHE.

Specifically, the conductive film 21 is provided above the semiconductor substrate 20 with an insulator layer interposed therebetween. For example, the conductive film 21 is formed in a plate shape spreading along an XY plane, and used as the source line SL. The conductive film 21 includes, for example, silicon (Si).

Although it is not illustrated, a circuit, such as the sense amplifier module 16, is provided in a region between the semiconductor substrate 20 and the conductive film 21.

The conductive film 22 is provided above the conductive film 21 with an insulator film interposed therebetween. For example, the conductive film 22 is formed in a plate shape spreading along the XY plane, and used as the select gate line SGS. The conductive film 22 includes, for example, silicon (Si).

Insulator layers and conductive films 23 are alternately stacked above the conductive film 22. For example, each of the conductive films 23 is formed in a plate shape spreading along the XY plane. The stacked conductive films 23 are used as the respective word lines WL0 to WL7 in order from the semiconductor substrate 20 side. The conductive films 23 include metal, such as tungsten (W).

The conductive film 24 is provided above the uppermost conductive film 23 with an insulator layer interposed therebetween. The conductive film 24 is formed in a plate shape spreading along the XY plane, and used as the dummy word line DWL. The conductive film 24 includes metal, such as tungsten (W).

The conductive film 25 is provided above the conductive film 24 with an insulator layer interposed therebetween. The conductive film 25 is formed in a plate shape spreading along the XY plane, and used as the select word line SGD. The conductive film 25 includes, for example, tungsten (W). For example, the conductive film 24 and the conductive film 25 are separated from each other with a silicon oxide ($SiO_2$) film.

The conductive film 26 is provided above the conductive film 25 with an insulator layer interposed therebetween. For example, the conductive film 26 is formed in a line shape extending in the Y direction, and used as the bit line BL. Specifically, a plurality of conductive films 26 are arranged in the X direction in a region not illustrated. The conductive film 26 includes, for example, copper (Cu).

Each of the memory pillars MP includes a lower pillar LP and an upper pillar UP. The upper pillar UP is provided above the lower pillar LP. It suffices that the upper pillar UP includes a portion overlapping the lower pillar LP at least in plan view.

The lower pillar LP is formed in a columnar shape extending in the Z direction, and penetrates, for example, the conductive films 22 to 24. The upper end of the lower pillar LP is included in, for example, a layer between the layer provided with the conductive film 24 and the layer provided with the conductive film 25. The lower end of the lower pillar LP is included in, for example, the layer provided with the conductive film 21.

The upper pillar UP is formed in a columnar shape extending in the Z direction, and penetrates, for example, the conductive film 25. The upper end of the upper pillar UP is included in, for example, a layer between the layer provided with the conductive film 25 and the layer provided with the conductive film 26. The lower end of the upper pillar UP is included in, for example, a layer between the layer provided with the conductive film 24 and the layer provided with the conductive film 25.

In addition, the lower pillar LP includes, for example, a core member 30, a semiconductor film 31, and a stacked film 32. The upper pillar UP includes, for example, a core member 40, semiconductor films 41 and 47, a passivation film 42, an insulator film 43, and a conductive film 46. For example, an insulator 44 and a passivation film 45 are provided between the lower pillar LP and the upper pillar UP.

The core member 30 is formed in a columnar shape extending in the Z direction. An upper end of the core member 30 is included in, for example, a layer between the layer provided with the conductive film 23 and the layer provided with the conductive film 24. A lower end of the core member 30 is included in, for example, the layer provided with the conductive film 21. The core member 30 includes an insulator, such as silicon oxide ($SiO_2$). The core member 30 is, for example, polysilazane.

Each of side surfaces and a bottom surface of the core member 30 are covered with the semiconductor film 31. An upper end of the semiconductor film 31 extends in a cylindrical manner in, for example, the Z direction, and included in a layer between the layer provided with the conductive film 24 and the layer provided with the conductive film 25.

The semiconductor film 31 contacts the conductive film 21 through the side surface of the lower pillar LP. The semiconductor film 31 is, for example, polysilicon (Si). The stacked film 32 covers the side surface and the bottom surface of the semiconductor film 31, except the portion in which the conductive film 21 contacts the semiconductor film 31.

The core member 40 is formed in a columnar shape extending in the Z direction. An upper end of the core member 40 is included in, for example, a layer between the layer provided with the conductive film 25 and the layer provided with the conductive film 26. A lower end of the core member 40 is included in, for example, the layer provided with the conductive film 24. Specifically, part of the core member 40 is included in the lower pillar LP. The core member 30 includes an insulator, such as silicon oxide ($SiO_2$). The core member 40 includes an insulator, such as silicon oxide ($SiO_2$).

The semiconductor film 47 is provided on an upper surface of the core member 40. The semiconductor film 47 is, for example, polysilicon (Si). Each of the side surface and the bottom surface of the core member 40 and the side surface of the semiconductor film 47 is covered with the semiconductor film 41. Specifically, part of the semiconductor film 41 is included in the lower pillar LP, in the same manner as the core member 40.

A bottom surface of the semiconductor film 41 contacts the upper surface of the core member 30. It suffices that the bottom surface of the semiconductor film 41 is disposed in a layer at least higher than the uppermost conductive film 23 in the lower pillar LP. As described above, part of each the core member 40 and the semiconductor film 41 included in the upper pillar UP is included in the lower pillar LP.

The side surface of the semiconductor film 41 contact the semiconductor film 31 in the lower pillar LP. The semiconductor films 31 and 41 are electrically connected through the contact portion. For example, the side surface of the semiconductor film 41 contact the internal wall of the semiconductor film 31 in the layer provided with the conductive film 24. The semiconductor film 41 is, for example, polysilicon (Si).

The side surface of the semiconductor film 41 is covered with the passivation film 42 except the contact portion between the semiconductor films 31 and 41. Part of the passivation film 42 is included in the lower pillar LP, and contacts the internal wall of the semiconductor film 31 in the upper end portion of the lower pillar LP. The material selected as the passivation film 42 is a material enabling increase in etching select ratio in the etch-back process in the manufacturing process of the semiconductor memory device 1 described later. The passivation film 42 is, for example, a semiconductor, and includes silicon (Si).

A side surface of the passivation film 42 is covered with the insulator film 43 in the upper pillar UP. The insulator film 43 includes, for example, silicon oxide ($SiO_2$) and silicon nitride (SiN). In other words, the insulator film 43 is a silicon oxide (SiON) film including nitrogen.

Part of a side surface of the insulator film 43 is covered with the conductive film 46. A side surface of the conductive film 46 contacts the conductive film 25. The conductive film 46 is electrically connected to the conductive film 25, and used as the select gate line SGD together with the conductive film 25.

The conductive film 46 is, for example, polysilicon doped with impurities. Examples of the impurities doped into the conductive film 46 include phosphorus. The conductive film 46 has a larger height (thickness) in the Z direction than that of the conductive film 25. In addition, for example, the layer including an upper surface of the conductive film 46 is provided higher than the layer including the upper surface of the conductive film 25, and the layer including a bottom surface of the conductive film 46 is provided lower than the layer including the bottom surface of the conductive film 25.

The upper surface of the conductive film 46 contacts the insulator film 43. Specifically, the insulator film 43 includes a portion provided along the shape of the upper portion of the conductive film 46. Consequently, for example, each of the semiconductor film 41 and the passivation film 42 includes a portion extending along the shape of the insulator film 43.

In addition, the side surface of the conductive film 46 is provided continuously with respect to a side surface of the insulator film 43. In other words, a part of the side surface of the conductive film 46 is aligned with a part of the side surface of the insulator film 43. The expression "side surface is provided continuously" in the present specification means that first and second constituent elements are provided in the same contact hole, a side surface of each of the first and the second constituent elements contacts the internal wall of the contact hole, and the boundary portion between the first and the second constituent elements contacts the internal wall of the contact hole. For this reason, the external diameter of each of the first and the second constituent elements with continuously provided side surfaces continuously changes at the boundary between the first and the second constituent elements and in the portion contacting the internal wall of the contact hole. In the present specification, the term "external diameter" means the external diameter in a cross section parallel with the semiconductor substrate 20.

Between the upper pillar UP and the lower pillar LP, the side surface of the passivation film 42 is covered with the insulator 44. The insulator 44 contacts the lower end portion of the insulator film 43. The insulator 44 includes, for example, silicon oxide ($SiO_2$).

The insulator 44 is covered with the passivation film 45 except the portions contacting the passivation film 42 or the insulator film 43. The passivation film 45 contacts, for example, each of the upper surface of the semiconductor film 31, the upper surface of the stacked film 32, the lower end portion of the insulator film 43, and the bottom surface of the conductive film 46. The passivation film 45 is an insulator and includes, for example, silicon (Si).

As described above, each of the memory pillars MP has a structure in which the semiconductor films 41 and 47 in the upper pillar UP are electrically connected to the semiconductor film 31 in the lower pillar LP.

In each of the memory pillars MP, the external diameter of the upper pillar UP may be different from the external diameter of the lower pillar LP in a cross section parallel with the surface of the semiconductor substrate 20. Specifically, the external diameter of each of the memory pillars MP may include a portion that does not continuously change between the upper pillar UP and the lower pillar LP.

A columnar contact CP is provided on the semiconductor film 47. In the illustrated region, contacts CP corresponding to two memory pillars MP in the four memory pillars MP are illustrated. The memory pillars MP with which no contacts CP are connected in the illustrated region are connected to contacts CP in a region not illustrated.

One conductive film 26, that is, one bit line BL contacts the upper surface of the contact CP. The memory pillar MP and the conductive film 26 may be electrically connected through two or more contacts, or may be electrically connected through other wires.

The slits SLT are formed in a plate shape extending in the Z direction and divide, for example, the conductive films 22 to 24. The upper end of each of the slits SLT is included in, for example, a layer between the layer provided with the conductive film 24 and the layer provided with the conductive film 25. The lower end of each of the slits SLT is included in, for example, the layer provided with the conductive film 21.

An insulator is embedded in each of the slits SLT. The insulator includes, for example, silicon oxide ($SiO_2$). Each of the slits SLT may be formed of a plurality of types of insulators. For example, before silicon oxide is embedded into the slit SLT, silicon nitride (SiN) may be formed as side walls of the slit SLT.

Each of the slits SHE is formed in a plate shape extending in the Z direction and divides, for example, the conductive film 25. A portion of the conductive film 25 held between the adjacent slits SHE is used as the select gate line SGD of one string unit SU.

For example, the upper end of each of the slits SHE is aligned with the upper ends of the upper pillars UP. The lower end of each of the slits SHE is included in, for example, the layer provided with the insulator 44. In plan view, each of the slits SHE arranged between the slits SLT contacts the memory pillar MP. Each of the slits SHE arranged to overlap the slit SLT in plan view contacts the slit SLT.

In the structure of the memory pillars MP explained above, for example, a portion in which the memory pillar MP crosses the conductive film 22 functions as the select transistor ST2. A portion in which the memory pillar MP crosses the conductive film 23 functions as the memory cell transistor MT.

A portion in which the memory pillar MP crosses the conductive film 24 functions as the dummy transistor DT. A portion in which the memory pillar MP crosses the conductive films 25 and 46 functions as the select transistor ST1.

Specifically, the semiconductor film 31 functions as a channel of each of the memory cell transistors MT, the dummy transistor DT, and the select transistor ST2. The semiconductor film 41 functions as a channel of the select transistor ST1. The height of the conductive film 46 corresponds to the gate length of the select transistor ST1.

The following is an explanation of an example of the structure of each of the memory pillars MP in a cross section parallel with the surface of the semiconductor substrate 20, with reference to FIG. 5, FIG. 6, FIG. 7, and FIG. 8.

Figure 5:
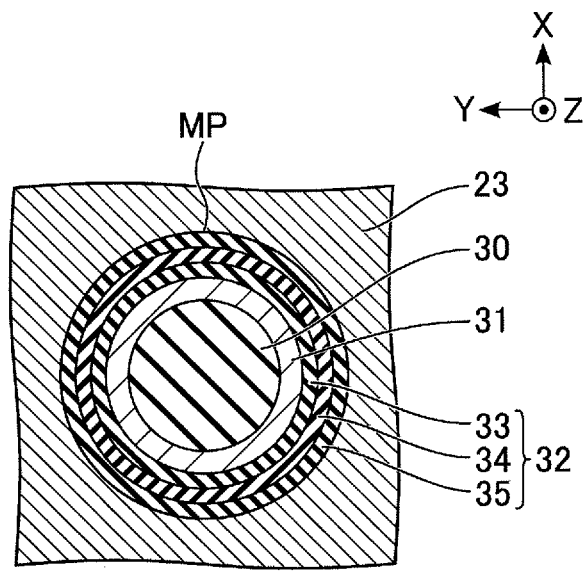

FIG. 5 is a cross-sectional view taken along line V-V of FIG. 4, and illustrates an example of a cross-sectional structure of each of the memory pillars MP in the layer including the conductive film 23. As illustrated in FIG. 5, the core member 30 is provided in a central portion of the memory pillar MP in the layer including the conductive film 23.

The side surface of the core member 30 is surrounded with the semiconductor film 31. The side surface of the semiconductor film 31 is surrounded with the stacked film 32. Specifically, the stacked film 32 includes, for example, a tunnel oxide film 33, an insulator film 34, and a block insulator film 35.

The semiconductor film 31 is surrounded with the tunnel oxide film 33. The tunnel oxide film 33 is surrounded with the insulator film 34. The insulator film 34 is surrounded with the block insulator film 35. The block insulator film 35 is surrounded with the conductive film 23.

The tunnel oxide film 33 includes, for example, silicon oxide ($SiO_2$). The insulator film 34 includes, for example, silicon nitride (SiN). The block insulator film 35 includes, for example, silicon oxide ($SiO_2$). In a layer structure of the stacked film 32 as described above, the insulator film 34 is used as the charge accumulation layer of the memory cell transistor MT.

Figure 6:
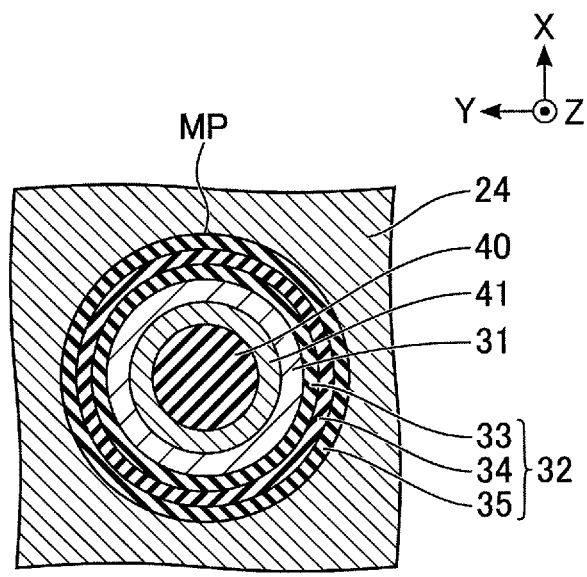

FIG. 6 is a cross-sectional view taken along line VI-VI of FIG. 4, and illustrates an example of a cross-sectional structure of each of the memory pillars MP in the layer including the conductive film 24. As illustrated in FIG. 6, the core member 40 is provided in the central portion of the memory pillar MP in the layer including the conductive film 24.

The side surface of the core member 40 is surrounded with the semiconductor film 41. The side surface of the semiconductor film 41 is surrounded with the semiconductor film 31. The semiconductor film 31 is surrounded with the tunnel oxide film 33. The tunnel oxide film 33 is surrounded with the insulator film 34. The insulator film 34 is surrounded with the block insulator film 35. The block insulator film 35 is surrounded with the conductive film 24.

FIG. 7 is a cross-sectional view taken along line VII-VII of FIG. 4, and illustrates an example of a cross-sectional structure of each of the memory pillars MP in the layer including the insulator 44. As illustrated in FIG. 7, the core member 40 is provided in the central portion of the memory pillar MP in the layer including the insulator 44.

The side surface of the core member 40 is surrounded with the semiconductor film 41. The side surface of the semiconductor film 41 is surrounded with the passivation film 42. The side surface of the passivation film 42 is surrounded with the insulator 44. The side surface of the insulator 44 is surrounded with the passivation film 45. The side surface of the passivation film 45 is surrounded with an interlayer insulator film INS.

FIG. 8 is a cross-sectional view taken along line VIII-VIII of FIG. 4, and illustrates an example of a cross-sectional structure of each of the memory pillars MP contacting the slit SHE in the layer including the conductive film 25. As illustrated in FIG. 8, the core member 40 is provided in the central portion of the memory pillar MP in the layer including the conductive film 25.

The side surface of the core member 40 is surrounded with the semiconductor film 41. The side surface of the semiconductor film 41 is surrounded with the passivation film 42. The side surface of the passivation film 42 is surrounded with the insulator film 43. The side surface of the insulator film 43 is surrounded with the conductive film 46. The side surface of the conductive film 46 is surrounded with the conductive film 25 and the slit SHE.

FIG. 8 illustrates the case where part of the side surface of the conductive film 46 contacts the slit SHE, but the conductive film 46 does not necessarily contact the slit SHE. In each of the memory pillars MP, it suffices that at least the conductive film 46 covers the insulator film 43, and the conductive film 46 is electrically connected to the conductive film 25.

In the structure of the memory cell array 10 described above, the number of conductive films 23 is designed on the basis of the number of word lines WL. The number of conductive film 24 is designed on the basis of the number of dummy word line DWL. A plurality of conductive films 22 provided in a plurality of layers may be assigned to the select gate line SGS. When the select gate line SGS is provided in a plurality of layers, conductors different from the conductive film 22 may be used.

[1-2] Method for Manufacturing Semiconductor Memory Device 1

The following is an explanation of an example of a series of manufacturing process from formation of the source line SL part to formation of the select gate line SGD in order with reference to FIG. 9 to FIG. 44.

Each of FIG. 9 to FIG. 23 and FIG. 25 to FIG. 44 illustrates an example of a cross-sectional structure of a structure corresponding to the memory cell array 10, in a manufacturing process of the semiconductor memory device 1 according to the embodiment. FIG. 24 illustrates an example of a plan layout of the structure corresponding to the memory cell array 10 in the manufacturing process of the semiconductor memory device 1 according to the embodiment.

In the following explanation, the term "wafer" indicates a structure formed on the semiconductor substrate 20 in the manufacturing process of the semiconductor memory device 1. The expression "on the wafer" means an upper surface of the structure formed on the semiconductor memory device 20, and a surface exposed in the hole, in the manufacturing process of the semiconductor memory device 1.

First, as illustrated in FIG. 9, a stacked structure corresponding to the source line SL is formed. Specifically, an insulator layer 50 is formed on the semiconductor substrate 20. Thereafter, a conductive film 51, a sacrificial member 52, a conductive film 53, and an insulator layer 54 are formed in order on the insulator layer 50. Each of the conductive films 51 and 53 includes, for example, silicon (Si). The sacrificial member 52 is a material capable of having an etching select ratio higher than that of each of the conductive films 51 and 53.

In the wiring layer in which the conductive film 51, the sacrificial member 52, and the conductive film 53 are formed by this step, a group of conductive films used as the source line SL is formed by a step described layer. Although illustration thereof is omitted, circuits such as the row decoder module 15 and the sense amplifier module 16 are formed in the insulator layer 50.

Thereafter, as illustrated in FIG. 10, a conductive film 55, and a plurality of insulator layers 56 and a plurality of sacrificial members 57 are stacked. Specifically, first, the conductive film 55 is formed on the insulator layer 54. Thereafter, a plurality of insulator layers 56 and sacrificial members 57 are alternately stacked on the conductive film 55. An insulator layer 58 is formed on the uppermost sacrificial member 57.

The number of the sacrificial members 57 to be formed corresponds to, for example, the number of stacked word lines WL and the dummy word line DWL. The conductive film 55 is, for example, polysilicon (Si). The conductive film 55 corresponds to, for example, the conductive film 22 explained with reference to FIG. 4, and is used as the select gate line SGS. Each of the insulator layers 56 and 58 includes, for example, silicon oxide ($SiO_2$). The sacrificial members 57 include, for example, silicon nitride (SiN).

Figure 11:
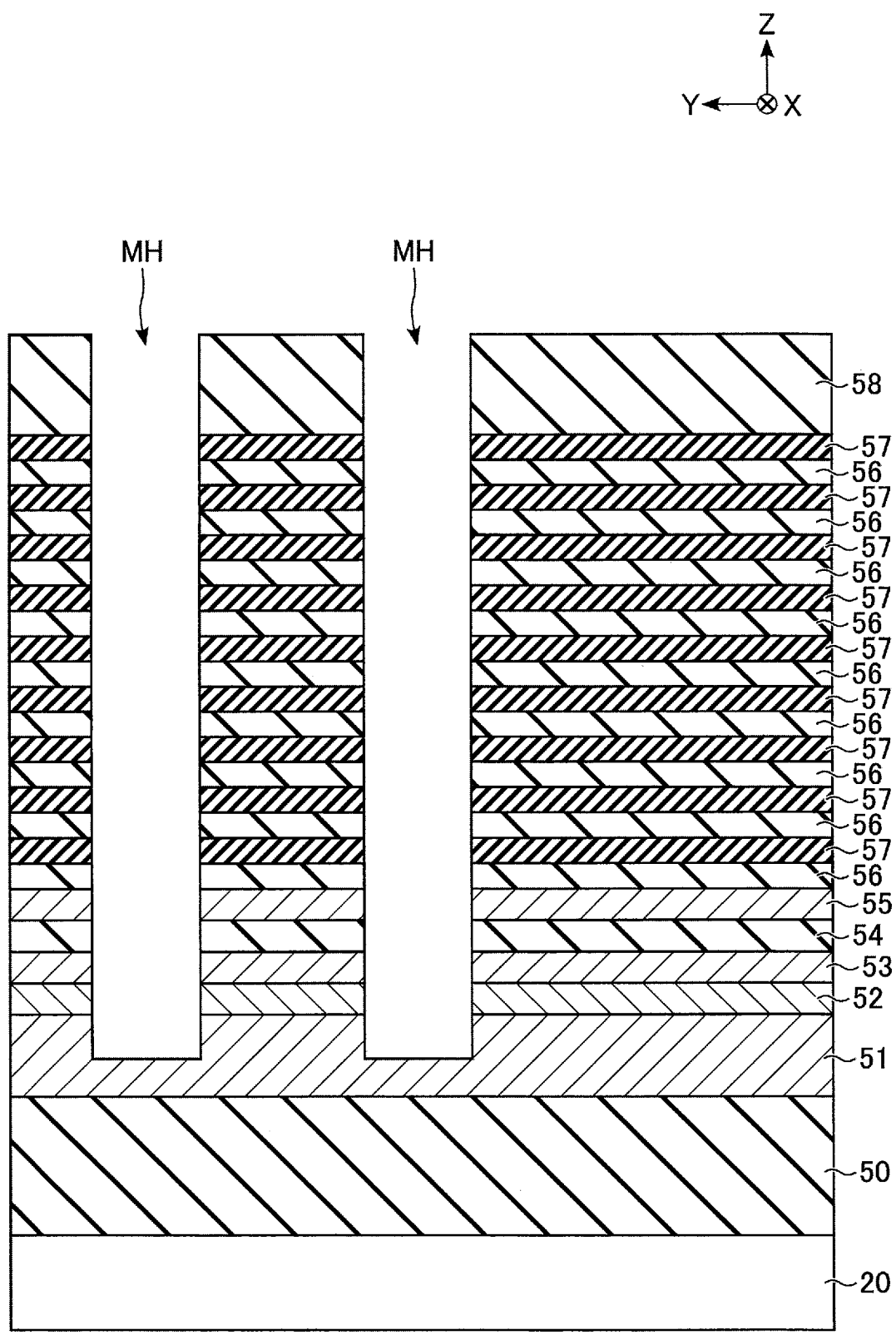

Thereafter, as illustrated in FIG. 11, memory holes MH are formed. Specifically, first, a mask in which regions to form memory pillars MP are opened is formed on the insulator layer 58 by photolithography or the like. Thereafter, anisotropic etching using the formed mask is performed to form memory holes MH.

By this step, the memory holes MH penetrate each of the insulator layer 58, the sacrificial members 57, the insulator layers 56, the conductive film 55, the insulator layer 54, the conductive film 53, and the sacrificial member 52. The bottom portion of each of the memory hole MH is stopped in, for example, the layer provided with the conductive film 51. For example, RIE (Reactive Ion Etching) is used as the etching method at this step.

Thereafter, as illustrated in FIG. 11, films of materials corresponding to the lower pillar LP are formed in each of the memory holes MH. Specifically, for example, the stacked film 32 (block insulator film 35, insulator film 34, and tunnel oxide film 33) and the semiconductor film 31 are formed in this order on the upper surface of the insulator layer 58 and the internal wall of each of the memory holes MH. Thereafter, the core member 30 is formed on the upper surface of the semiconductor film 31 and the internal wall of the semiconductor film 31 in each of the memory holes MH. In this manner, the memory holes MH are filled with the stacked film 32, the semiconductor film 31, and the core member 30.

Thereafter, as illustrated in FIG. 13, etchback is performed to remove part of each of the stacked film 32, the semiconductor film 31, and the core member 30. Specifically, part of each of the stacked film 32, the semiconductor film 31, and the core member 30 formed on the upper surface of the wafer and in an upper portion of each of the memory holes MH are removed.

In this etching, recess processing is performed such that the upper surface of each of the stacked film 32 and the semiconductor film 31 in each of the memory holes MH is positioned higher than the uppermost sacrificial member 57, and recess processing is performed such that the upper surface of the core member 30 in each of the memory holes MH is positioned, for example, higher than the uppermost sacrificial member 57 and lower than the upper surface of each of the stacked film 32 and the semiconductor film 31.

Thereafter, as illustrated in FIG. 14, a cap member is formed in an upper portion of each of the memory holes MH. Specifically, for example, a passivation film 59 and a sacrificial member 60 are successively formed on the wafer, and the upper portion of each of the memory holes MH is filled with the passivation film 59 and the sacrificial member 60. In addition, after the passivation film 59 and the sacrificial member 60 formed outside the memory holes MH are removed by etchback or the like, a passivation film 61 is formed on the whole surface of the wafer.

In this manner, a structure in which the upper surface of each of the memory holes MH is covered with the cap member is formed. The passivation films 59 and 61 included in the cap members correspond to, for example, the passivation film 45 explained with reference to FIG. 4, and are used as the passivation film for wet etching performed at a step described later. Each of the passivation films 59 and 61 includes, for example, silicon oxide ($SiO_2$). The sacrificial member 60 is, for example, amorphous silicon.

Thereafter, as illustrated in FIG. 15, slits SLT are formed. Specifically, first, a mask in which regions to form slits SLT are opened is formed on the passivation film 61 by photolithography or the like. Thereafter, by etching using the formed mask, slits SLT are formed to reach the conductive film 51 from the upper surface of the passivation film 61.

In the etching of this step, the bottom portion of each of the slits SLT is preferably stopped in the layer provided with the conductive film 51, but it suffices that the bottom portion of each of the slits SLT at least reaches the layer provided with the sacrificial member 52. For example, anisotropic etching, such as RIE, is used as the etching method at this step.

Thereafter, as illustrated in FIG. 16, the sacrificial member 52 is selectively removed by etching through the slits SLT. Thereafter, part of the stacked film 32 provided on the side surfaces of the memory halls MH is removed through the region in which the sacrificial member 52 has been removed. The solid structure of the structure from which the sacrificial member 52 has been removed is maintained with, for example, a structure in each of the memory halls MH.

This step exposes the semiconductor film 31 in each of the memory halls MH in the portion from which the sacrificial member 32 has been removed. For example, wet etching is used as the method for selectively removing the sacrificial member 52 at this step. In the wet etching, an aqueous solution with a higher select ratio of the sacrificial member 52 than that of the conductive films 51 and 53 is used.

Thereafter, as illustrated in FIG. 17, a conductive film 62 is formed. Specifically, for example, by chemical vapor deposition (CVD), the conductive film 62 is embedded in the space from which the sacrificial member 52 has been removed. Thereafter, by etchback, the conductive film 62 formed inside the slits SLT is removed, while the conductive film 62 formed from the slits SLT to the side surface of the semiconductor film 31 in each of the memory holes MH is left.

By this step, the semiconductor film 31 in each of the memory halls MH is electrically connected to the group of the conductive films 51, 62, and 53. The group of the conductive films 51, 62, and 53 corresponds to, for example, the conductive film 21 explained with reference to FIG. 4, and is used as the source line SL. For example, phosphorus-doped polysilicon is formed as the conductive film 62.

Thereafter, as illustrated in FIG. 18, the sacrificial members 57 are removed. Specifically, first, the surfaces of the conductive films 51, 62, and 53 (for example, polysilicon) exposed in the slits SLT are oxidized, and an oxide passivation film (not illustrated) is formed. Thereafter, the sacrificial members 57 are removed by wet etching using hot phosphoric acid or the like. The solid structure of the structure from which the sacrificial members 57 have been removed is maintained with, for example, the structure in each of the memory halls MH.

Thereafter, as illustrated in FIG. 19, conductive films 23 and 24 are formed. Specifically, for example, conductive films are embedded in the spaces from which the sacrificial members 57 have been removed, by CVD or the like. Thereafter, the conductive films formed in the slits SLT are subjected to etchback, and the stacked conductive films are separated. As a result, the conductive film 23 or 24 is formed in each of the spaces from which the sacrificial members 57 have been removed.

Specifically, by this step, a plurality of conductive films corresponding to the word lines WL0 to WL7 and the dummy word lines DWL are formed. The conductive films formed at this step may be formed after barrier metal is formed. In this case, for example, titanium nitride (TiN) is used as the barrier metal, and tungsten (W) is used as the conductive films.

Figure 20:
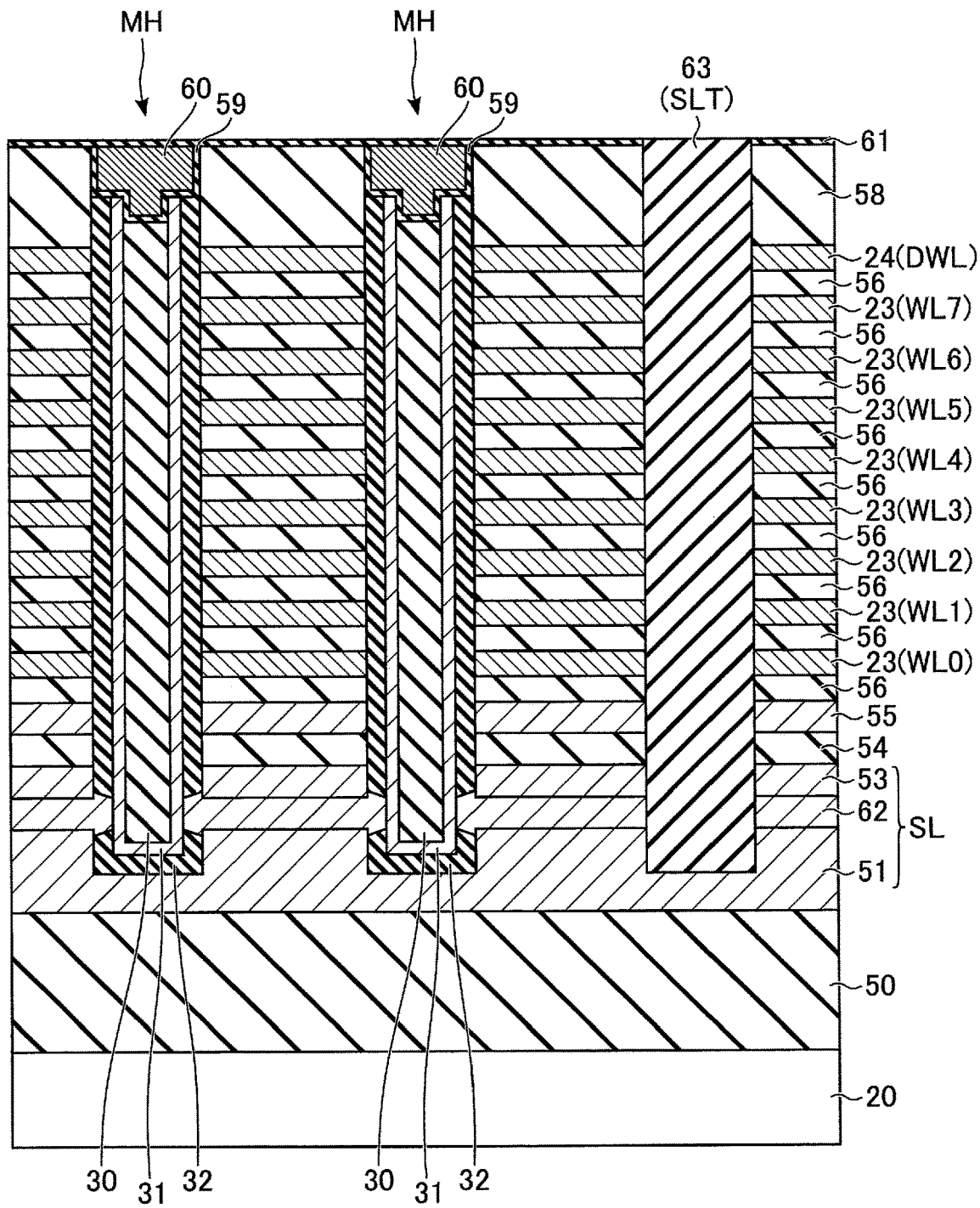

Thereafter, as illustrated in FIG. 20, an insulator 63 is embedded in each of the slits SLT. Specifically, for example, the insulator 63 is embedded in each of the slits SLT, and the upper surface of the wafer is flattened by CMP (Chemical Mechanical Polishing). The insulator 63 includes, for example, silicon oxide ($SiO_2$). At this step, before the insulator 63 is embedded in the slits SLT, silicon nitride (SiN) or the like may be formed as side walls of the slits SLT.

Thereafter, as illustrated in FIG. 21, a sacrificial member 64 is formed on the wafer. The film thickness of the sacrificial member 64 corresponds to, for example, the height of the upper pillars UP explained with reference to FIG. 4. The sacrificial member 64 includes, for example, silicon nitride (SiN).

Thereafter, as illustrated in FIG. 22, slits SHE are formed. Specifically, first, a mask in which regions to form slits SHE are opened is formed on the sacrificial member 64 by photolithography or the like. Thereafter, by etching using the formed mask, slits SHE are formed to reach, for example, the layer provided with the conductive film 58 from the upper surface of the sacrificial member 64. When the slits SHE are formed, part of the insulator 63 may be removed, or part of the structure in each of the memory holes MH may be removed.

Figure 23:
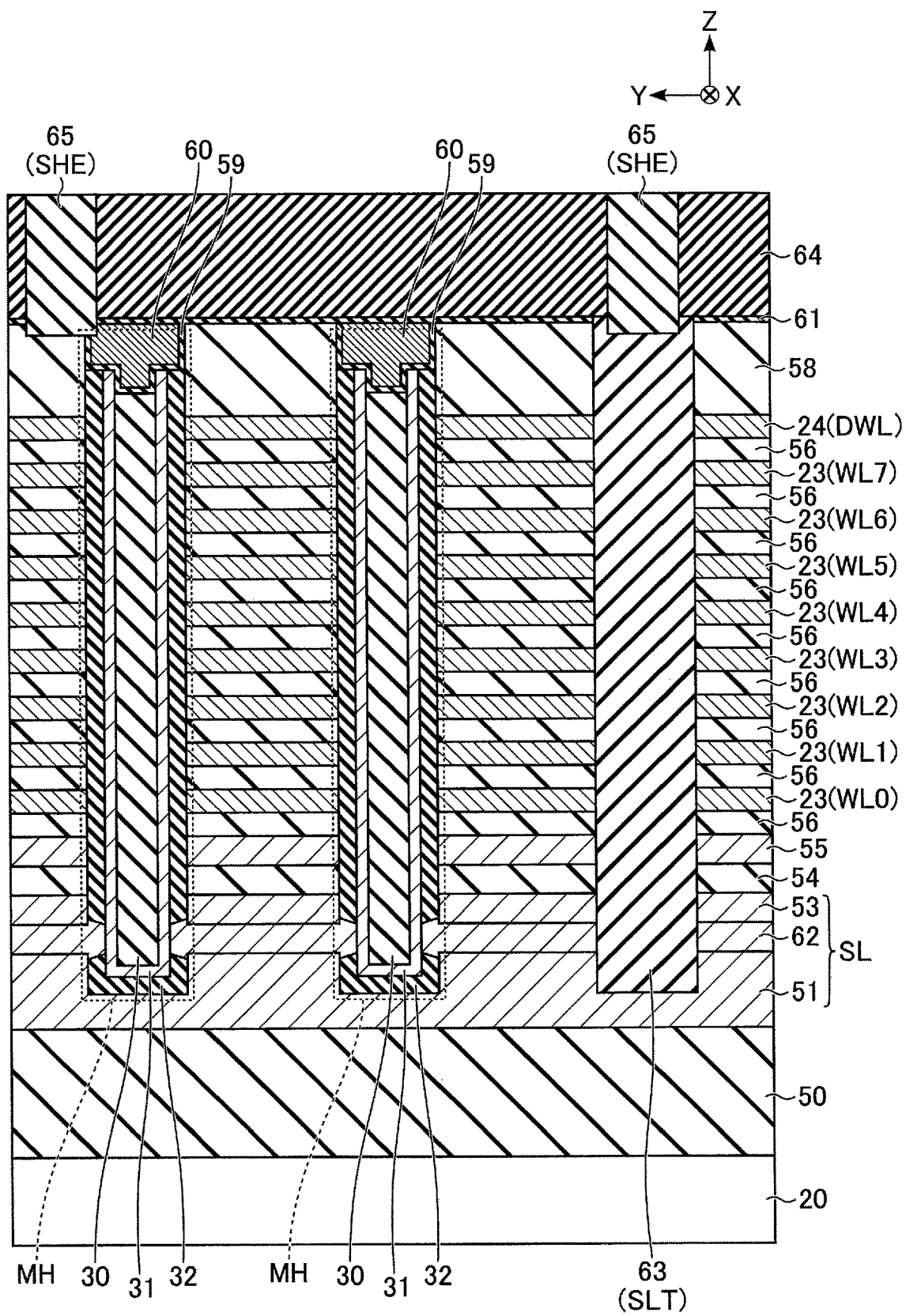

Thereafter, as illustrated in FIG. 23, an insulator 65 is embedded in each of the slits SHE. Specifically, for example, the insulator 65 is embedded in each of the slits SHE, and thereafter the upper surface of the wafer is flattened by CMP. The insulator 65 includes, for example, silicon oxide ($SiO_2$).

Thereafter, as illustrated in FIG. 24 and FIG. 25, SGD holes SH are formed. Specifically, first, a mask in which regions to form SGD holes, that is, regions overlapping the memory holes MH are opened is formed on the sacrificial member 64 by photolithography or the like. Thereafter, by etching using the formed mask, SGD holes SH are formed such that, for example, the upper surface of the passivation film 61 is exposed from the upper surface of the sacrificial member 64.

At this step, the SGD holes SH are arranged in a zigzag manner, and arranged such that the SGD holes SH overlap different memory holes MH. The SGD holes SH include holes processed to overlap the slits SHE and holes processed apart from the slits SHE. The passivation film 61 is used, for example, as an etching stopper.

Figure 26:
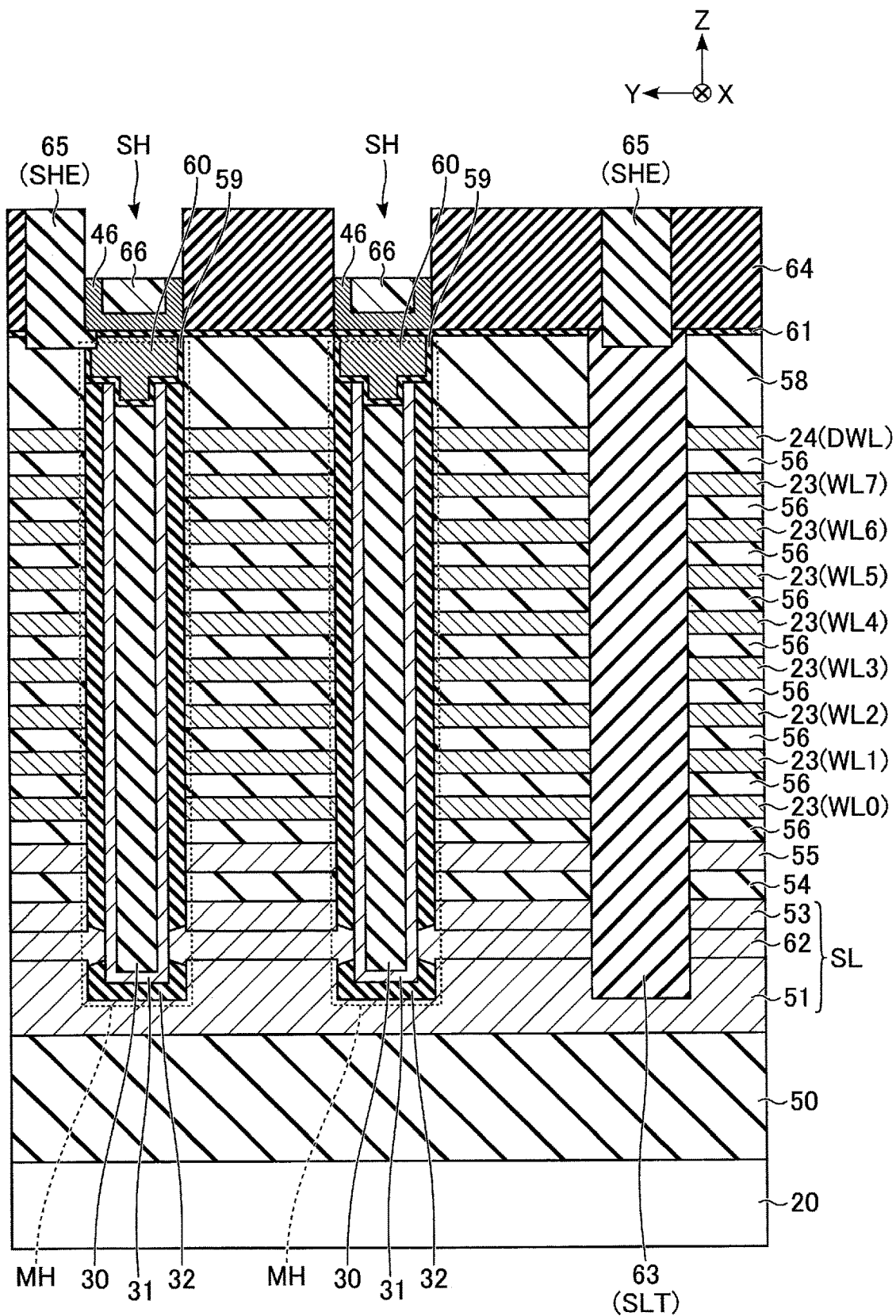

Thereafter, as illustrated in FIG. 26, a conductive film 46 and a resist 66 are formed.

Specifically, first, the conductive film 46 is formed on the wafer by, for example, CVD. The thickness of the conductive film 46 corresponds to the thickness of the conductive film 46 illustrated in FIG. 4 in the cross section parallel with the semiconductor substrate 20. The conductive film 46 is, for example, polysilicon.

Thereafter, the resist 66 is applied on the wafer, for example, and the resist 66 is solidified by subsequent thermal treatment. Thereafter, etchback is performed to remove the resist 66 formed on the upper surface of the wafer, and the resist 66 remained in the SGD holes SH is processed to have a desired height.

Thereafter, the conductive film 46 formed higher than the resist 66 is removed. At this step, etching is performed with a high select ratio for the conductive film 46. In addition, in this etching, the conductive film 46 remains in the SGD holes SH on the basis of the height of the resist 66.

Thereafter, as illustrated in FIG. 27, the conductive film 46 is processed to form a nitride film 67.

Specifically, first, the resist 66 is removed, and the bottom portion of each of the SGD holes SH is etched. The resist 66 is removed by, for example, wet treatment. The bottom portion of each of the SGD holes SH is processed by, for example, anisotropic etching such that at least the passivation film 61 is penetrated to expose the sacrificial member 60.

Thereafter, a nitride film 67 is formed on the wafer by, for example, CVD. The thickness of the nitride film 67 corresponds to the thickness of the insulator film 43 illustrated in FIG. 4. The nitride film 67 is, for example, nitride silicon (SiN).

Figure 28:
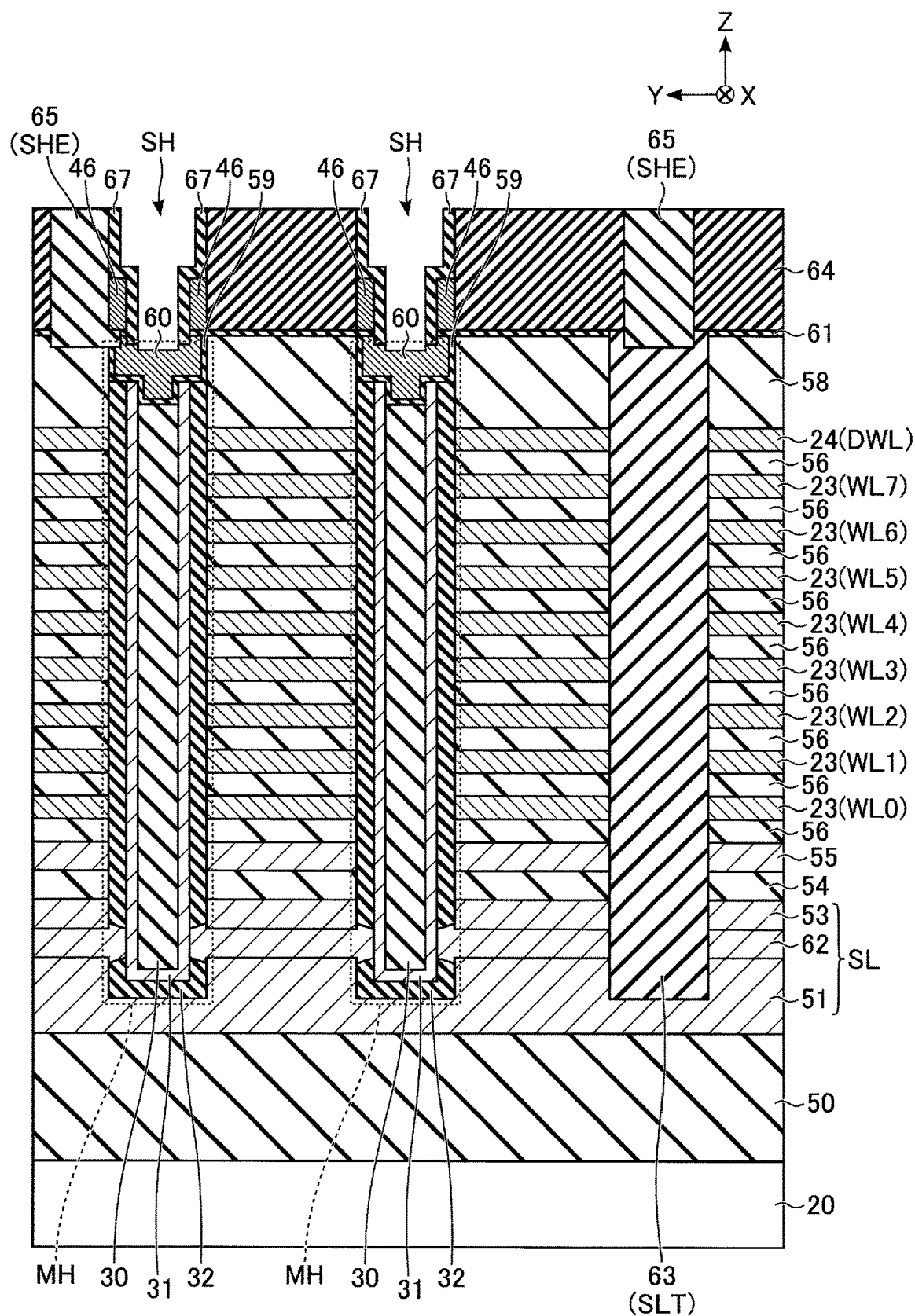

Thereafter, as illustrated in FIG. 28, the nitride film 67 formed in the bottom portion of each of the SGD holes SH is removed. Specifically, the bottom portion of each of the SGD holes SH is processed by, for example, anisotropic etching such that at least the nitride film 67 is penetrated to expose the sacrificial member 60. By this step, the nitride film 67 formed on the upper surface of the wafer is removed.

Thereafter, as illustrated in FIG. 29, the sacrificial member 60 is removed by wet etching through the SGD holes SH. By this step, a space that is not seen in plan view is formed in each of the SGD holes SH. The space overlaps the region in which the nitride film 67 is formed in plan view, and is included in the layer provided with the insulator layer 58.

Figure 30:
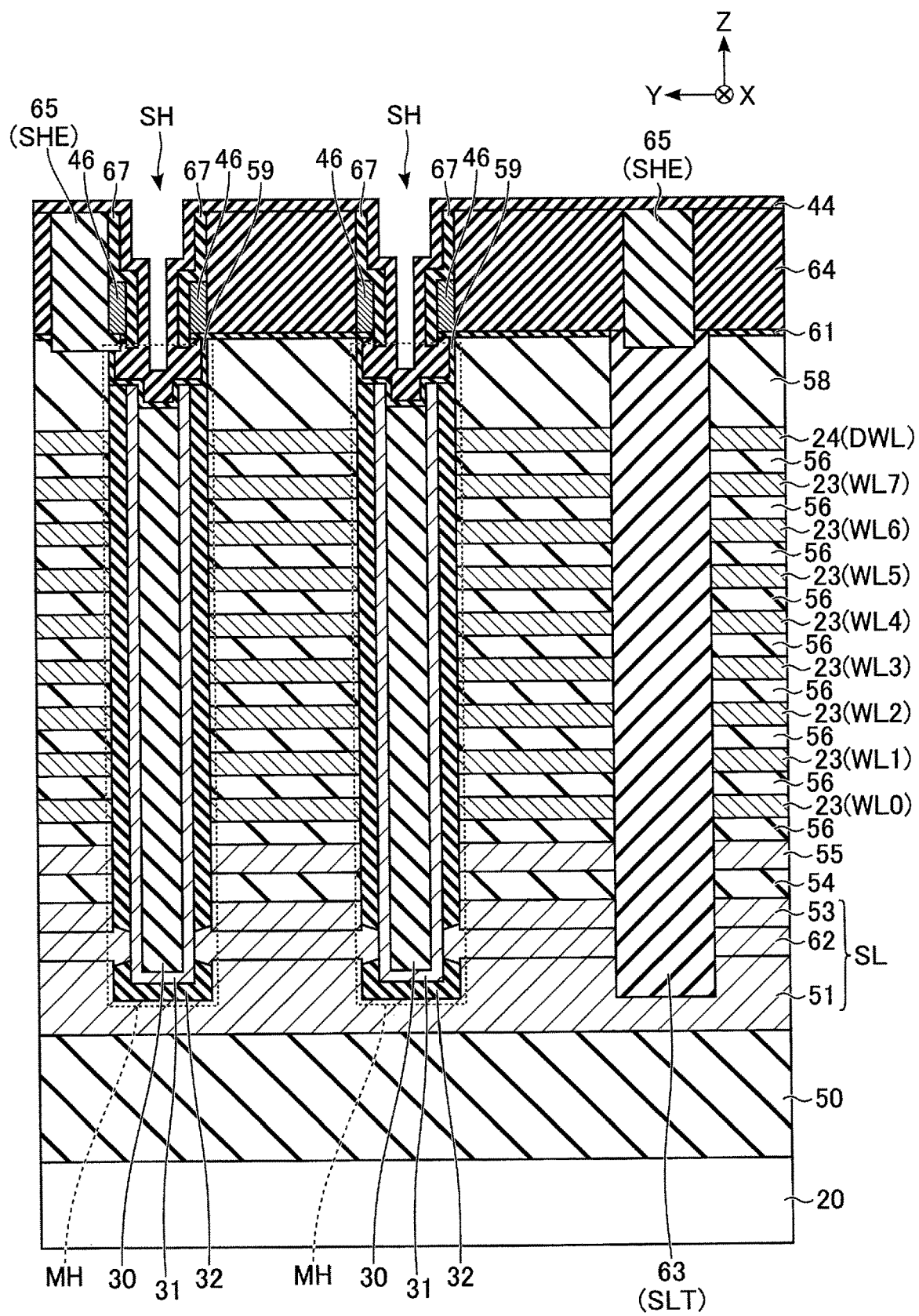

Thereafter, as illustrated in FIG. 30, the insulator 44 is formed on the wafer by, for example, CVD. The inside of each of the SGD holes SH may be entirely filled with the insulator 44, or may be unfilled. At this step, it suffices that at least the space explained with reference to FIG. 29 is filled with the insulator 44.

Thereafter, as illustrated in FIG. 31, for example, anisotropic etching is performed to remove the insulator 44 formed on the upper surface of the wafer, the side surface of the nitride film 67 in each of the SGD holes SH, and the bottom portion of each of the SGD holes SH. In this etching, processing is performed such that the bottom portion of each of the SGD holes SH is positioned in, for example, a layer between the layer including the upper portions of the semiconductor film 31 and the stacked film 32 formed in each of the memory holes MH and the layer provided with the conductive layer 24.

Thereafter, as illustrated in FIG. 32, for example, the nitride film 67 is subjected to radical oxidation to form the insulator film 43 explained with reference to FIG. 4 from the nitride film 67. At this step, nitrogen in the nitride film 67 is replaced by oxygen, but part of nitrogen in the nitride film 67 may remain. As a result, at this step, the insulator film 43 (oxide film) including nitrogen is formed.

Thereafter, as illustrated in FIG. 33, the passivation film 42 is formed on the wafer by, for example, CVD. The thickness of the passivation film 42 corresponds to the thickness of the passivation film 42 illustrated in FIG. 4. A material enabling setting of high etching select ratio thereof to the core member 30 is selected as the passivation film 42. The passivation film 42 is, for example, amorphous silicon.

Thereafter, as illustrated in FIG. 34, etchback is performed to remove the passivation film 42 formed on the bottom portion of each of the SGD holes SH and the upper surface of the wafer. Thereafter, part of the core member 30 in each of the SGD holes SH is removed by, for example, wet etching. At this step, the core member 30 is processed such that the upper surface of the core member 30 is positioned in a layer between the layer provided with the conductive film 24 and the layer provided with the conductive film 23. The present wet etching enables removal of, for example, an oxide film and/or impurities formed on the surface of the semiconductor film 31.

Thereafter, as illustrated in FIG. 35, the semiconductor film 41 and the core member 40 are successively formed on the wafer by, for example, CVD. By this step, the semiconductor film 41 is formed on the side surface and the bottom surface of each of the SGD holes SH, and the inside of each of the SGD holes SH is filled with the core member 40. The thickness of the semiconductor film 41 corresponds to the thickness of the semiconductor film 41 illustrated in FIG. 4.

Figure 36:
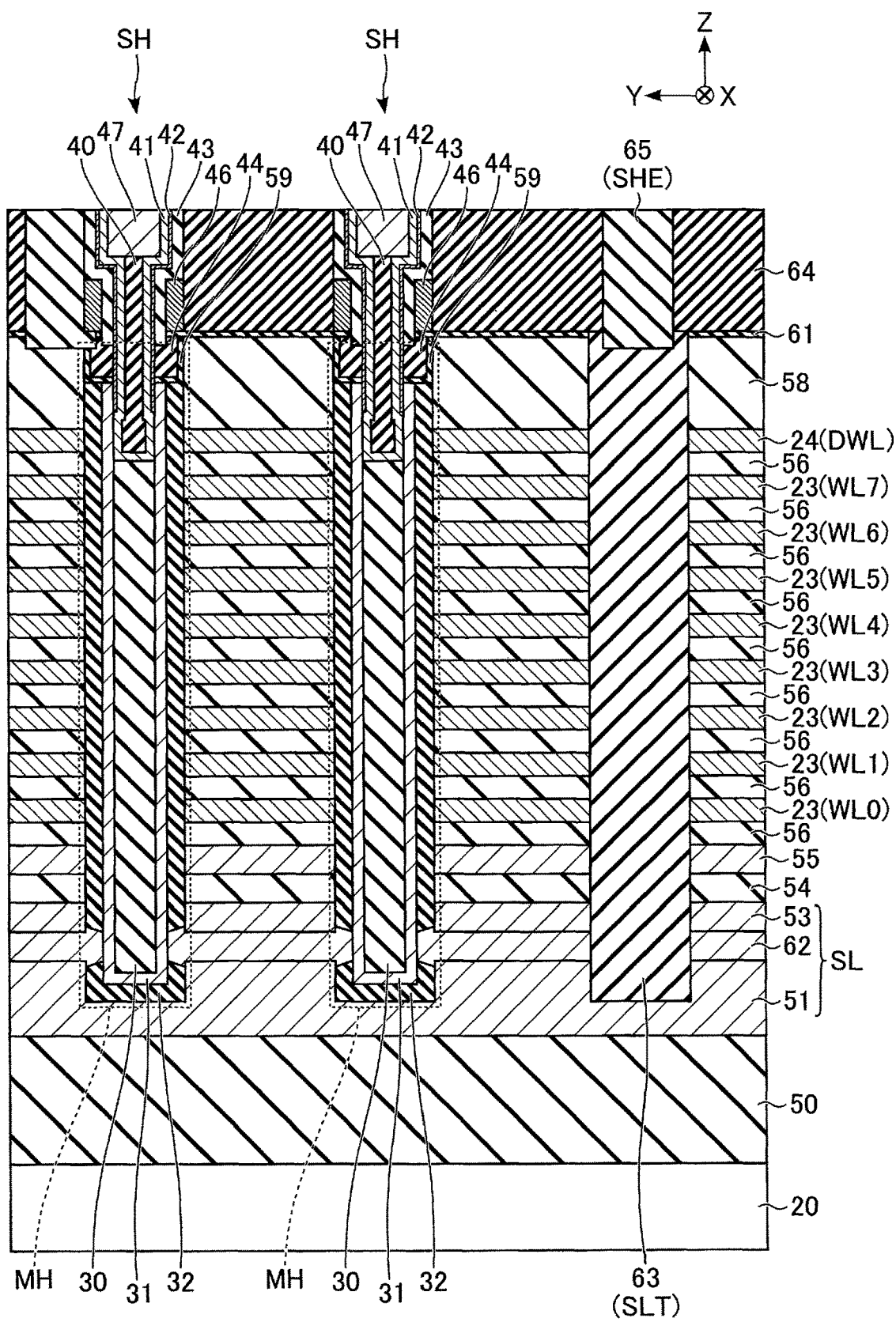

Thereafter, as illustrated in FIG. 36, the semiconductor film 47 is formed in an upper portion in each of the SGD holes SH.

Specifically, first, for example, etchback is performed to remove the core member 40 and the semiconductor film 41 formed on the upper surface of the wafer. At this step, the core member 40 formed in the upper portion of each of the SGD holes SH is also removed. In the present etching, processing is performed such that the upper surface of the core member 40 is positioned at least higher than the layer provided with the conductive film 46.

Thereafter, the semiconductor film 47 is formed on the wafer by, for example, CVD, and the inside of each of the SGD holes SH is filled with the semiconductor film 47. Thereafter, etchback is performed to remove the semiconductor film 47 formed on the upper surface of the wafer, and form the structure in which the semiconductor film 47 is left in each of the SGD holes SH.

Thereafter, as illustrated in FIG. 37, a barrier metal 68 and a conductive film 69 are formed.

Specifically, first, wet etching is performed with, for example, a high select ratio for the sacrificial member 64 is performed to remove the sacrificial member 64. By this step, the side surface of the conductive film 46 formed in each of the SGD holes SH is exposed. At this step, because the etching select ratio for the insulator 65 is high, the portion in which the conductive film 46 and the insulator 65 is not exposed.

In addition, for example, the conductive film 69 is formed after the barrier metal 68 is formed. At this step, the conductive film 69 is formed to cover, for example, the structure formed in each of the SGD holes SH and the insulator 65 formed in each of the slits SLT. For example, titanium nitride (TiN) is used as the barrier metal 68.

Figure 38:
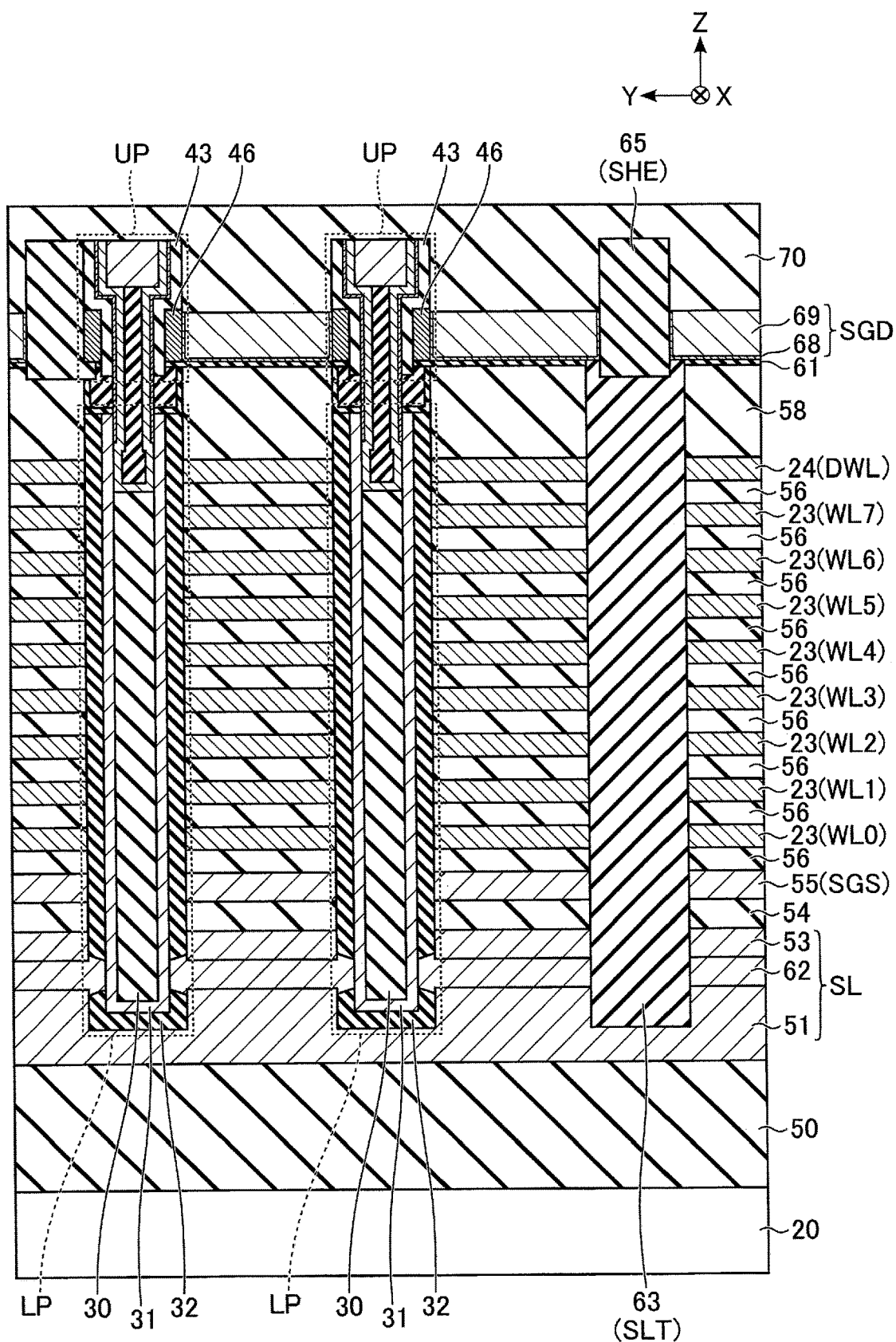

Thereafter, as illustrated in FIG. 38, the barrier metal 68 and the conductive film 69 are processed to form an insulator 70.

Specifically, first, for example, etchback is performed to remove part of the conductive film 69. At this step, the conductive film 69 is removed from the upper surface of each of the structures in the SGD holes SH and the insulator 65 in the slits SHE, and processed to be included in, for example, in the layer provided with the conductive film 46. A combination of the barrier metal 68 and the conductive film 69 corresponds to the conductive film 25 explained with reference to FIG. 4.

Thereafter, the insulator 70 is formed by, for example, CVD. At this step, the insulator 70 is formed to cover at least the structure in each of the SGD holes SH and the insulator 65 in each of the slits SHE. Thereafter, the upper surface of the insulator 70 is flattened by, for example, CMP.

The manufacturing process described above forms the memory pillars MP (lower pillar LP and upper pillars UP), the source line SL, the select gate lines SGS and SGD, and the word lines WL, and the dummy word line DWL connected to the memory pillar MP.

The manufacturing process explained above is a mere example, but other processing may be inserted between the manufacturing steps. Part of the manufacturing steps may be replaced with each other. For example, the replacement processing of the source line SL and the word lines WL using the slits SLT may be performed after the select gate line SGD is formed.

[1-3] Effects of Embodiment

The following is an explanation of details of the effects in the semiconductor memory device 1 according to the embodiment.

In a semiconductor memory in which memory cells are stacked in a three-dimensional manner, plate-shaped wires used as word lines WL are stacked, and a structure to function as memory cell transistors MT is formed in each of memory pillars penetrating (extending through) the stacked wires. In such a semiconductor memory, a plate-shaped select gate line SGD is formed. The memory pillars extend through the select gate line SGD in the same manner as the word lines WL. In this manner, the select gate line SGD is properly divided to achieve operations performed for each page.

The arrangement density of memory pillars is preferably increased to increase the storage capacity per unit area of the semiconductor memory device. However, when the arrangement density of memory pillars is increased, it is difficult in manufacturing to divide the select gate line SGD.

As a countermeasure against the problem, it is considered to form the pillar (lower pillar) to form the memory cell transistor MT separately from the pillar (upper pillar) to form the select transistor ST1. In such a case, for example, when the lower pillar is formed, a sacrificial member to form the upper pillar is formed. Thereafter, after the slit SHE to divide the select gate line SGD is formed in the sacrificial member, the upper pillar and the select gate line SGD are formed.

As a result, the semiconductor memory device is enabled to allow the upper pillar corresponding to the select transistor ST1 to overlap the slit SHE to divide the select gate line SGD. Specifically, this structure enables increase in arrangement density of the memory pillars in the semiconductor memory device, and increase in storage capacity per unit area of the memory cell array.

However, when the upper pillar is allowed to overlap the slit SHE, it may cause variations in characteristics of the select transistor ST1 in the upper pillar overlapping the slit SHE.

By contrast, in the semiconductor memory device 1 according to the embodiment, the conductive film 46 is formed in the upper pillar UP corresponding to the select transistor ST1. The conductive film 46 is electrically connected to the plate-shaped conductive film 25, and functions as part of the select gate line SGD. This structure enables the semiconductor memory device 1 according to the embodiment to suppress variations in characteristics of the select transistor ST1.

In addition, the semiconductor memory device 1 according to the embodiment has the structure in which, in the upper pillar UP, the conductive film 46 is formed on the side surface of the insulator film 43 functioning as the gate insulator film of the select transistor ST1, and the insulator film 43 covers the upper surface of the conductive film 46.

Specifically, in the semiconductor memory device 1 according to the embodiment, the insulator film 43 used as the gate insulator film of the select transistor ST1 separates the conductive films 25 and 46 used as the select gate line SGD from the semiconductor film 41 used as the channel of the select transistor ST1.

This structure enables the semiconductor memory device 1 according to the embodiment to sufficiently secure the interval between the gate electrode and the channel of the select transistor ST1, and insulate the gate electrode and the channel of the select transistor ST1.

In addition, for example, the nitride film 67 used as the passivation film in the manufacturing steps explained with reference to FIG. 29 to FIG. 31 is oxidized to be used as the insulator film 46. This structure enables the method for manufacturing the semiconductor memory device 1 according to the embodiment is enabled to provide the gate insulator film of the select transistor ST1 with good film quality.

This structure enables the semiconductor memory device 1 according to the embodiment to suppress the leak electric power between the gate electrode and the channel of the select transistor ST1, and suppress power consumption. The semiconductor memory device 1 according to the embodiment is also enabled to suppress occurrence of short-circuit failure between the gate electrode and the channel in the select transistor ST1, and improves the yield of the semiconductor memory device.

In the structure of the semiconductor memory device in which the lower pillar and the upper pillar are separately formed as described above, an etching stopper is preferably prepared for etching to form SGD holes SH corresponding to the upper pillars.

The semiconductor memory device 1 according to the embodiment has the structure in which a cap member (sacrificial member 60 and passivation films 59 and 61) usable as an etching stopper is formed, after the core member 30, the semiconductor film 31, and the stacked film 32 are formed in each of the memory holes MH corresponding to the lower pillars LP. The cap member is removed after processing of the SGD holes SH.

In addition, the semiconductor film 41 functioning as the channel of the select transistor ST1 in the upper pillar UP is brought into contact with the internal wall of the semiconductor film 31 functioning as the channels of the memory cell transistors MT in the lower pillar LP. This forms a structure in which the channels of the transistors are electrically connected between the upper pillar UP and the lower pillar LP.

This structure enables the semiconductor memory device 1 according to the embodiment to have a structure in which, for example, oxide silicon (SiO$_2$) insulates the select gate line SGD (conductive film 25) from the dummy word line DWL (conductive film 24).

In other words, the structure of the semiconductor memory device 1 according to the embodiment enables processing of the SGD holes SH without inserting any ferroelectric film (such as aluminum oxide (ALO)) difficult to process, as the etching stopper film, between the conductive film 24 and the conductive film 25.

This structure enables the semiconductor memory device 1 according to the embodiment to suppress increase in process difficulty in formation of the upper pillars UP. Accordingly, the semiconductor memory device 1 according to the embodiment is enabled to suppress occurrence of failure relating to upper pillars UP and improve the yield of the semiconductor memory device.

[2] Modification

According to one embodiment, a semiconductor memory device includes a plurality of first conductive films, a second conductive film, a first pillar including a first semiconductor film and a first insulator, a second semiconductor film, and a second pillar including a second insulator and a third conductive film. The plurality of first conductive films are stacked with respective insulator layers interposed therebetween. The second conductive film is provided above the first conductive films with an insulator layer interposed therebetween. The first semiconductor film penetrate the first conductive films in a stacking direction of the first conductive films. The first insulator is provided on a side surface of the first semiconductor film. The second semiconductor film is provided on the first pillar. The second semiconductor film penetrate the second conductive film in the stacking direction and is electrically connected to the first semiconductor film in the first pillar. The second insulator is provided on a side surface of the second semiconductor film. The third conductive film includes a side surface and an upper surface covered with the second insulator and contacting the second conductive film. This structure enables the semiconductor memory device according to the embodiment to improve the yield.

The embodiment illustrates the case where one dummy word line DWL is formed, but the structure is not limited thereto. For example, a plurality of dummy word lines DWL may be provided between the conductive film 23 corresponding to the uppermost word line WL and the conductive film 25 corresponding to the select gate line SGD. The number and arrangement of the dummy word line DWL may properly be changed.

Each of the lower pillars LP may have a structure in which a plurality of pillars are connected in the Z direction. For example, each of the lower pillars LP may have a structure in which a pillar piercing the conductive film 22 (select gate line SGS) and the conductive film 23 (word line WL) is connected to a pillar piercing a plurality of conductive films 23. In such a case, the dummy transistor DT and the dummy word line DWL may be disposed in the vicinity of the portion of connecting the pillars.

The embodiment illustrates the case where the semiconductor memory device 1 has the structure in which circuits such as the sense amplifier module 16 are provided under the memory cell array 10, but the structure is not limited thereto. For example, the semiconductor memory device 1 may have a structure in which the memory cell array 10 and the sense amplifier module 16 are formed on the semiconductor substrate 20. In this case, the memory pillars MP have a structure in which the semiconductor film 31 is electrically connected to the source line SL through, for example, the bottom surface of each of the memory pillars MP.

In the present specification, the term "connect" means that the elements are electrically connected, and does not exclude the case where another element or member is interposed between the elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would wall within the scope and spirit of the inventions.

What is claimed is:

1. A semiconductor memory device comprising:
   a plurality of first conductive films stacked with respective insulator layers interposed therebetween;
   a second conductive film provided above the first conductive films with an insulator layer interposed therebetween;
   a first pillar including a first semiconductor film and a first insulator, the first semiconductor film penetrating the first conductive films in a stacking direction of the first conductive films, the first insulator provided on a side surface of the first semiconductor film;
   a second semiconductor film on the first pillar, the second semiconductor film penetrating the second conductive film in the stacking direction and electrically connected to the first semiconductor film in the first pillar; and
   a second pillar including a second insulator and a third conductive film, the second insulator provided on a side surface of the second semiconductor film, the third conductive film including a side surface and an upper surface covered with the second insulator and contacting the second conductive film.

2. The device of claim 1, wherein, in the second pillar, a side surface of the second insulator provided on the upper surface of the third conductive film and the side surface of the third conductive film are aligned.

3. The device of claim 1, wherein the third conductive film is thicker than the second conductive film in the stacking direction.

4. The device of claim 1, wherein the second insulator is an oxide film including nitrogen.

5. The device of claim 1, wherein, in the second pillar, each of the second semiconductor film and the second insulator includes a portion provided along the third conductive film.

6. The device of claim 1, wherein, in the second pillar, an insulator different from the second insulator is formed on a bottom surface of the third conductive film.

7. The device of claim 1, wherein
   the first pillar further includes a third insulator extending in the stacking direction and including a side surface and a bottom surface covered with the first semiconductor film, and the second pillar further includes a fourth insulator extending in the stacking direction and including a side surface and a bottom surface covered with the second semiconductor film.

8. The device of claim 7, wherein the second pillar further includes a third semiconductor film contacting an upper surface of the fourth insulator and an internal wall of the second semiconductor film.

9. The device of claim 1, wherein
the second conductive film includes a first portion and a second portion separated from each other with a slit filled with an insulator, and
the slit contacts the second pillar through the first portion and the second pillar through the second portion.

10. The device of claim 1, wherein
the third conductive film is polysilicon, and
the second conductive film is metal.

11. The device of claim 10, wherein
the third conductive film is polysilicon doped with impurities.

12. A semiconductor memory device comprising:
a plurality of first conductive films stacked with respective insulator layers interposed therebetween;
a second conductive film provided above the first conductive films with an insulator layer interposed therebetween;
a first pillar including a first semiconductor film and a first insulator, the first semiconductor film penetrating the first conductive films in a stacking direction of the first conductive films, the first insulator provided on a side surface of the first semiconductor film; and
a second pillar on the first pillar, the second pillar including a second semiconductor film, a second insulator, and a third conductive film, the second semiconductor film penetrating the second conductive film in the stacking direction and contacting the side surface of the first semiconductor film in the first pillar, the second insulator provided on a side surface of the second semiconductor film, the third conductive film provided on a side surface of the second insulator.

13. The device of claim 12, wherein no ferroelectric film is included between the uppermost first conductive film in the stacked first conductive films and the second conductive film.

14. The device of claim 12, wherein a silicon oxide film separates the uppermost first conductive film in the stacked first conductive films from the second conductive film.

15. The device of claim 12, wherein the second pillar further includes a third semiconductor film different from the second insulator, the third semiconductor film including a portion extending in the stacking direction and held between the second semiconductor film and the second insulator, and a portion held between the first semiconductor film and the second semiconductor film in the first pillar.

16. The device of claim 12, wherein
each of portions at which the stacked first conductive films cross the first pillar functions as a dummy transistor or a memory cell,
the first conductive film corresponding to the memory cell is used as a word line,
the first conductive film corresponding to the dummy transistor is used as a dummy word line, and
a portion at which the first semiconductor film contacts the second semiconductor film is included in a layer provided with the dummy word line, and not included in a layer provided with the word line.

17. The device of claim 12, wherein
the first pillar further includes a third insulator extending in the stacking direction and including a side surface and a bottom surface covered with the first semiconductor film, and
the second pillar further includes a fourth insulator extending in the stacking direction and including a side surface and a bottom surface covered with the second semiconductor film.

18. The device of claim 12, wherein
the third conductive film is polysilicon doped with impurities, and
the second conductive film is metal.

19. A method of manufacturing a semiconductor memory device, comprising:
forming a stacked part in which first sacrificial members and first insulator are alternately stacked;
forming a first hole penetrating the stacked part;
forming, in the first hole, a first semiconductor film and a second insulator formed to surround an external periphery of the first semiconductor film, after the forming the first hole;
removing the first sacrificial members and forming first conductive films in spaces in which the first sacrificial members were provided, after the forming the first semiconductor film and the second insulator;
forming a third insulator and a second sacrificial member in order on the stacked part, after the forming the first conductive film;
forming a slit to divide the second sacrificial member and forming a fourth insulator in the slit, after the forming the second sacrificial member;
forming a second hole to overlap the first hole, after the forming the fourth insulator;
forming a second conductive film on a side surface of the second hole and forming a nitride film covering an upper surface and a side surface of the second conductive film, after the forming the second hole;
oxidizing the nitride film after the forming the nitride film;
forming a second semiconductor film in the second hole, after the oxidizing the nitride film; and
removing the second sacrificial member and forming a third conductive film in part of a region from which the second sacrificial member has been removed, after the forming the second semiconductor film.

20. The method of claim 19, further comprising:
forming a cap member in the first hole, after the forming the first semiconductor film and the second insulator and before the forming the third insulator, the cap member covering an upper portion of each of the first semiconductor film and the second insulator and covered with a first passivation film;
removing the first passivation film provided on an upper portion of the cap member, after the forming the second conductive film and before the forming the nitride film;
removing the cap member after the forming the nitride film and before the oxidizing the nitride film, and removing the first passivation film provided on a bottom portion of the cap member after the removing the cap member; and
forming a second passivation film on an internal wall of the second hole after the oxidizing the nitride film and before the forming the second semiconductor film, and exposing an internal wall of the first semiconductor film through the second hole after the forming the second passivation film.

* * * * *